(12) United States Patent
Kawasumi

(10) Patent No.: US 8,638,623 B2
(45) Date of Patent: Jan. 28, 2014

(54) TIMING GENERATION CIRCUIT, SEMICONDUCTOR STORAGE DEVICE AND TIMING GENERATION METHOD

(75) Inventor: Atsushi Kawasumi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 208 days.

(21) Appl. No.: 13/053,702

(22) Filed: Mar. 22, 2011

(65) Prior Publication Data

US 2012/0127811 A1    May 24, 2012

(30) Foreign Application Priority Data

Nov. 19, 2010   (JP) ................................. 2010-259123

(51) Int. Cl.
    *G11C 7/00*    (2006.01)
(52) U.S. Cl.
    USPC .......................................... 365/194; 365/205
(58) Field of Classification Search
    USPC .......................................... 365/194, 205, 154
    See application file for complete search history.

(56) References Cited

U.S. PATENT DOCUMENTS

| | | | | |
|---|---|---|---|---|
| 4,875,193 | A | * | 10/1989 | Segawa .......................... 365/207 |
| 6,088,292 | A | * | 7/2000 | Takahashi ................. 365/233.14 |
| 6,690,608 | B2 | | 2/2004 | Nii et al. |
| 2010/0165771 | A1 | | 7/2010 | Kawasumi |
| 2010/0220094 | A1 | | 9/2010 | Watanabe |

FOREIGN PATENT DOCUMENTS

| | | |
|---|---|---|
| JP | S61-133726 | 6/1986 |
| JP | 2003-323792 A | 11/2003 |
| JP | 2009-109598 A | 5/2009 |
| JP | 2010-157279 | 7/2010 |

OTHER PUBLICATIONS

Explanation of Non-English Language Reference.
Notification of Reasons for Rejection mailed Jul. 12, 2013, in corresponding Japanese Pat. App. No. 2010-259123 in six (6) pages.

* cited by examiner

*Primary Examiner* — Huan Hoang
(74) *Attorney, Agent, or Firm* — Knobbe, Martens, Olson & Bear LLP

(57) ABSTRACT

According to an embodiment, a semiconductor storage device includes a memory cell array, a plurality of sense amplifiers and a timing generation circuit. The memory cell array includes a plurality of word lines, a plurality of bit lines crossing the plurality of word lines, and a plurality of memory cells provided in intersection portions of the plurality of word lines and the plurality of bit lines. The plurality of sense amplifiers is configured to detect a signal level of the corresponding bit lines. The timing generation circuit includes a timing selection circuit configured to select a timing in a preset order from among timings in which each bit line signal in the plurality of bit lines changes. The timing generation circuit is configured to generate activation timing to activate the plurality of sense amplifiers based on the selected timing.

9 Claims, 20 Drawing Sheets

TIMING GENERATION CIRCUIT, SEMICONDUCTOR STORAGE DEVICE AND TIMING GENERATION METHOD

CROSS REFERENCE TO RELATED APPLICATION

This application is based upon and claims the benefit of priority from the prior Japanese Patent Application No. 2010-259123 filed on Nov. 19, 2010 in Japan, the entire contents of which are incorporated herein by reference.

FIELD

Embodiments described herein relate generally to a timing generation circuit, a semiconductor storage device and a timing generation method.

BACKGROUND

If random variations of transistor increase with the progress of scaling in a semiconductor storage device, variations of a cell current to charge/discharge a bit line become noticeable. With variations of the cell current, a delay (bit line delay) until a desired potential difference appears in a pair of bit lines after the voltage of a word line rises also varies. Activation timing of a sense amplifier or inactivation timing of a word line attendant thereon in a memory is normally generated by a timing generator. However, according to this method, timing variations due to random variations of transistor generally cannot be accurately replicated. Thus, functionality is guaranteed by setting the timing considered to be the worst case. However, this method requires unnecessary timing margins, causing lower operating frequencies or increased power consumption.

Moreover, according to such a way of securing timing margins, fluctuations of optimum timing caused by changes of random variations or fluctuations of power supply voltage cannot be replicated satisfactorily.

DETAILED DESCRIPTION

According to an embodiment, a semiconductor storage device includes a memory cell array, a plurality of sense amplifiers and a timing generation circuit. The memory cell array includes a plurality of word lines, a plurality of bit lines crossing the plurality of word lines, and a plurality of memory cells provided in intersection portions of the plurality of word lines and the plurality of bit lines. The plurality of sense amplifiers is configured to detect a signal level of the corresponding bit lines. The timing generation circuit includes a timing selection circuit configured to select a timing in a preset order from among timings in which each bit line signal in the plurality of bit lines changes. The timing generation circuit is configured to generate activation timing to activate the plurality of sense amplifiers based on the selected timing.

Hereafter, the embodiments of the present invention will be described more specifically with reference to the drawings. These embodiments do not limit the present invention.

First Embodiment

The first embodiment is characterized in that a timing in a preset order is selected from among timings in which each bit line signal in a plurality of bit lines changes and sense amplifiers are activated based on the selected timing.

Figure 1:
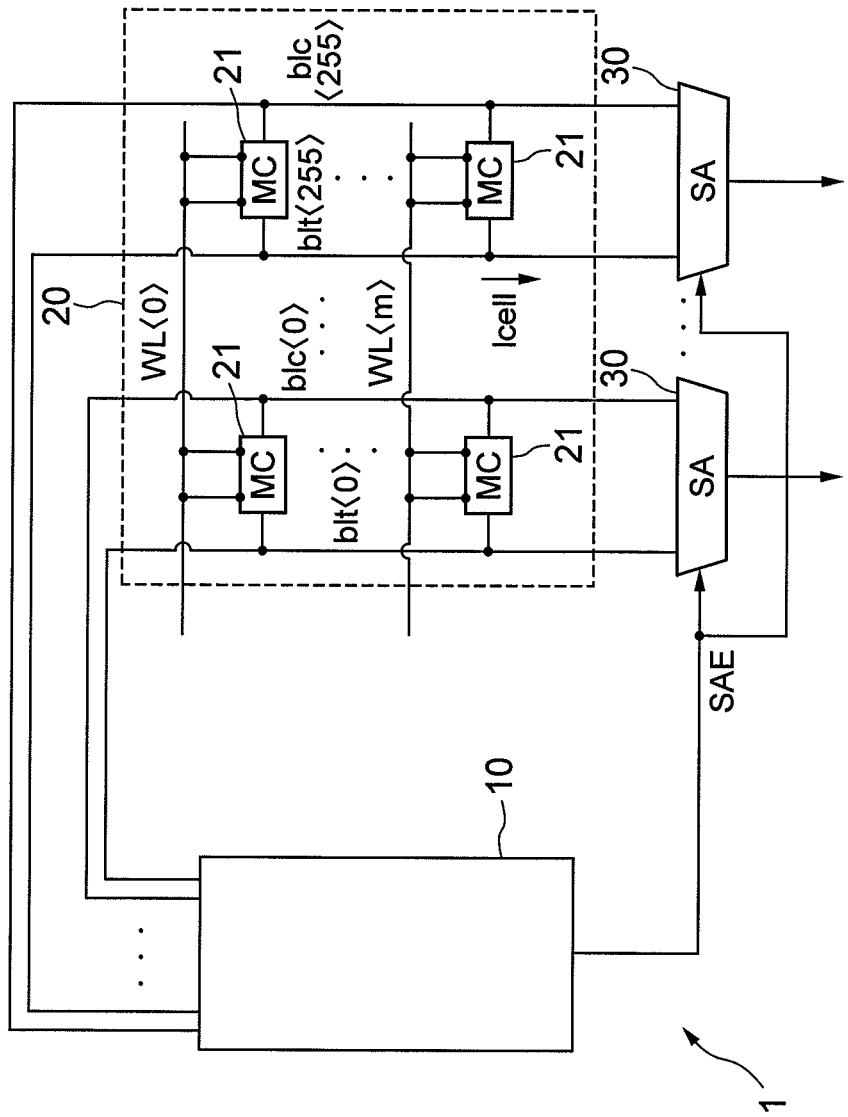
FIG. 1 is a block diagram showing an outline configuration of a semiconductor storage device according to the first embodiment of the present invention.

FIG. 1 is a block diagram showing an outline configuration of a semiconductor storage device according to the first embodiment of the present invention. A semiconductor storage device 1 in the present embodiment is a SRAM (Static Random Access Memory).

As shown in FIG. 1, the semiconductor storage device 1 includes a timing generation circuit 10, a memory cell array 20, and a plurality of sense amplifiers 30.

The timing generation circuit 10 selects the timing in the preset order from among the timings in which each bit line signal in a plurality of bit lines blt<0> to blt<255> and blc<0> to blc<255> changes and generates activating timing to activate the plurality of sense amplifiers 30 based on the selected timing. Then, the timing generation circuit 10 outputs a sense amplifier enable signal SAE whose signal level changes in the generated activation timing.

In other words, a plurality of bit line signals (timing signals) is input to the timing generation circuit 10, and the plurality of bit line signals has timings that varies with respect to the average value thereof. The timing generation circuit 10 selects the timing in the preset order from the input timing, and generates activation timing (reference timing) based on the selected timing.

The memory cell array 20 has a plurality of memory cells (SRAM cells) 21. The plurality of memory cells 21 is arranged like a matrix in a row direction and a column direction. Word lines WL<0> to WL<m> (m is an integer equal to 2 or greater) to select a row of the memory cells 21 are connected to the memory cell array 20. Also, the bit lines blt<0> to blt<255> and blc<0> to blc<255> are connected to the memory cell array 20.

That is, the memory cell array 20 has a plurality of word lines WL<0> to WL<m>, the plurality of bit lines blt<0> to blt<255> and blc<0> to blc<255> crossing the plurality of word lines, and the plurality of memory cells 21 provided in intersection portions of the plurality of word lines and the plurality of bit lines.

When activated by the sense amplifier enable signal SAE from the timing generation circuit 10, the plurality of sense amplifiers 30 detects the signal level of the corresponding bit line/bit line blt<0> to blt<255> and blc<0> to blc<255>.

That is, the sense amplifier 30 detects data stored in the memory cell 21 based on signals read from the memory cell 21 to one of the bit lines blt<0> to blt<255> and one of the bit lines blc<0> to blc<255>. The detection means amplifying and holding data stored in the memory cell 21 for a predetermined period. The predetermined period is determined in accordance with the sense amplifier enable signal SAE. In the present embodiment, the sense amplifier 30 starts detection when the sense amplifier enable signal SAE rises to a high level and ends detection when the sense amplifier enable signal SAE falls to a low level.

Figure 2:
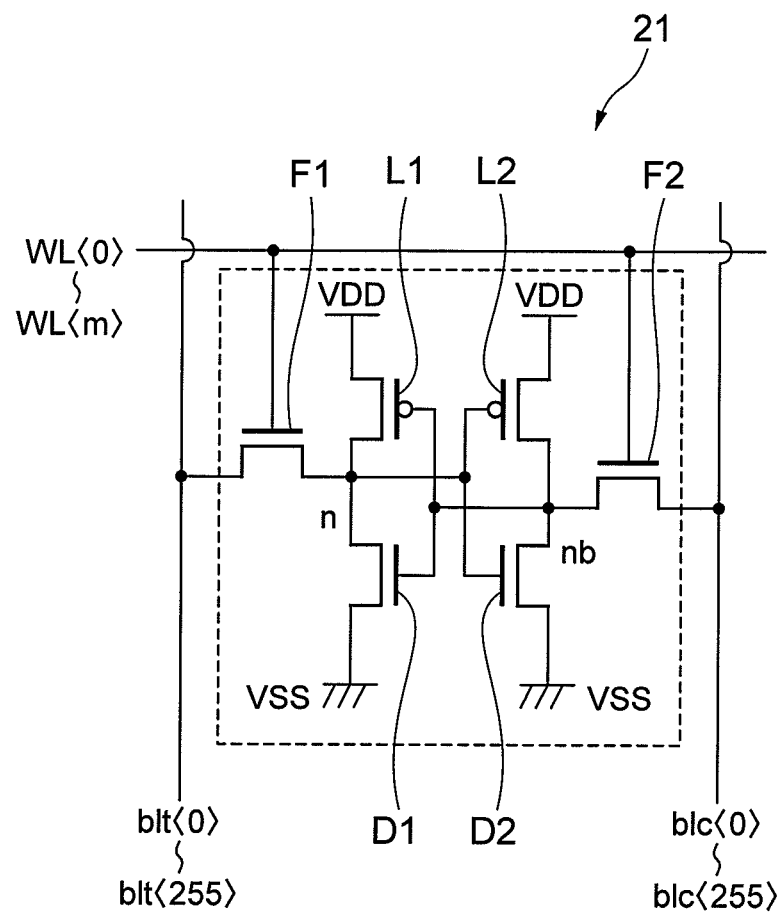
FIG. 2 is a circuit diagram showing an outline configuration of a memory cell according to the first embodiment of the present invention.

FIG. 2 is a circuit diagram showing an outline configuration of a memory cell according to the first embodiment of the present invention.

As shown in FIG. 2, the memory cell 21 includes a pair of driving transistors D1, D2, a pair of load transistors L1, L2, and a pair of transmission transistors F1, F2. P-channel MOS field-effect transistors (hereinafter, referred to as PMOS transistors) can be used as the load transistors L1, L2 and N-channel MOS field-effect transistors (hereinafter, referred to as NMOS transistors) can be used as the driving transistors D1, D2 and the transmission transistors F1, F2. A power supply voltage VDD is connected to sources of the load transistors L1, L2. A ground voltage VSS is connected to the sources of the driving transistors D1, D2.

The driving transistor D1 and the load transistor L1 are connected in series to configure a CMOS inverter. The driving transistor D2 and the load transistor L2 are connected in series to configure a CMOS inverter. A flip-flop is configured by output and input of the pair of CMOS inverters being cross-coupled. Then, one of the word lines WL<0> to WL<m> is connected to gates of the transmission transistors F1, F2. Based on the above configuration of the flip-flop, a connection point of the drain of the driving transistor D1 and the drain of the load transistor L1 configures a storage node n and a connection point of the drain of the driving transistor D2 and the drain of the load transistor L2 configures a storage node nb.

One of the bit lines blt<0> to blt<255> is connected to the gate of the driving transistor D2, the gate of the load transistor L2, the drain of the driving transistor D1, and the drain of the load transistor L1 via the transmission transistor F1. One of the bit lines blc<0> to blc<255> is connected to the drain of the driving transistor D2, the drain of the load transistor L2, the gate of the driving transistor D1, and the gate of the load transistor L1 via the transmission transistor F2.

A word line driving driver (not shown) individually drives the word lines WL<0> to WL<m> in accordance with a selection signal output from a row decoder (not shown). Driving means outputting a predetermined voltage. The word line driving voltage can be used regardless of whether the voltage is higher or lower than the power supply voltage VDD.

Figure 3:
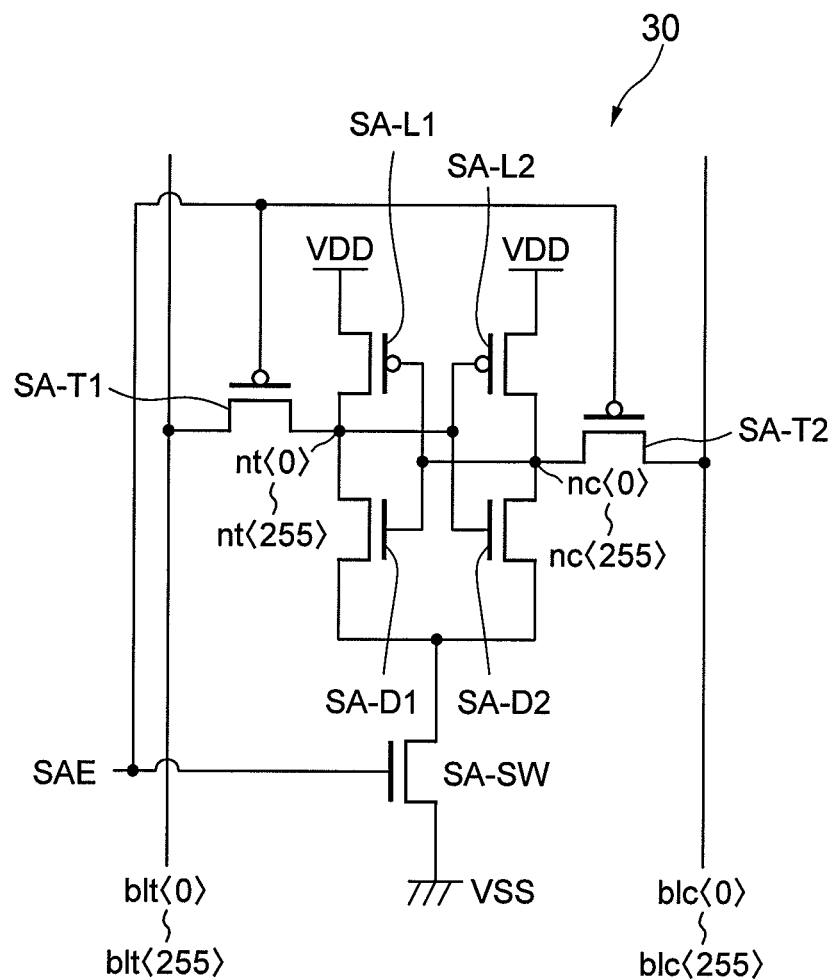
FIG. 3 is a circuit diagram showing an outline configuration of a sense amplifier according to the first embodiment of the present invention.

The sense amplifier 30 has a structure as shown, for example, in FIG. 3. That is, a pair of driving transistors SA-D1 and SA-D2, a pair of load transistors SA-L1 and SA-L2, a switching transistor SA-SW, and a pair of transmission transistors SA-T1 and SA-T2 are provided. PMOS transistors can be used as the load transistors SA-L1 and SA-L2 and the transmission transistors SA-T1 and SA-T2. NMOS transistors can be used as the driving transistors SA-D1 and SA-D2 and the switching transistor SA-SW.

The power supply voltage VDD is input to the source of the load transistor SA-L1. The drain of the driving transistor SA-D1 and the drain of the load transistor SA-L1 are connected. The gate of the driving transistor SA-D1 and the gate of the load transistor SA-L1 are connected. That is, a CMOS inverter is configured by the driving transistor SA-D1 and the load transistor SA-L1 being connected in series. Similarly, the power supply voltage VDD is input to the source of the load transistor SA-L2. The drain of the driving transistor SA-D2 and the drain of the load transistor SA-L2 are connected. The gate of the driving transistor SA-D2 and the gate of the load transistor SA-L2 are connected. That is, a CMOS inverter is configured by the driving transistor SA-D2 and the load transistor SA-L2 being connected in series. Then, a flip-flop is configured by output and input of the pair of CMOS inverters being cross-coupled.

Based on the above configuration of the flip-flop, a connection point of the drain of the driving transistor SA-D1 and the drain of the load transistor SA-L1 configures one of nodes nt<0> to nt<255> and a connection point of the drain of the driving transistor SA-D2 and the drain of the load transistor SA-L2 configures one of nodes nc<0> to nc<255>.

A common connection point of the drain of the driving transistor SA-D1 and the drain of the load transistor SA-L1 and a common connection point of the gate of the driving transistor SA-D2 and the gate of the load transistor SA-L2 are connected to one of the bit lines blt<0> to blt<255> via the transmission transistor SA-T1. Similarly, a common connection point of the drain of the driving transistor SA-D2 and the drain of the load transistor SA-L2 and a common connection point of the gate of the driving transistor SA-D1 and the gate of the load transistor SA-L1 are connected to one of the bit lines blc<0> to blc<255> via the transmission transistor SA-T2. The sense amplifier enable signal SAE is input into the gates of the transmission transistors SA-T1 and SA-T2.

The drain of the switching transistor SA-SW is connected to the source of the driving transistor SA-D1 and the source of the driving transistor SA-D2. The ground voltage VSS is input to the source of the switching transistor SA-SW. Then, the sense amplifier enable signal SAE is input into the gate of the switching transistor SA-SW. Therefore, if the sense amplifier enable signal SAE has a voltage higher than the ground voltage VSS, the switching transistor SA-SW is conducting (high enable) and a signal input through a bit line is amplified and held.

Reading performance of the memory cell 21 will be described.

A current that flows into the bit lines blt<0> to blt<255> or blc<0> to blc<255> from the memory cell 21, after the voltage of a word line rises, is a cell current Icell. The cell current Icell flows into the bit lines blt<0> to blt<255> via the transmission transistor F1 or into the bit lines blc<0> to blc<255> via the transmission transistor F2 in accordance with data held in the memory cell 21. Here, for the simplification of description, it is assumed that the cell current Icell is a current that flows into the bit lines blt<0> to blt<255> via the transmission transistor F1. Since the channel width of the driving transistor D1 is larger than the channel width of the transmission transistor F1 in the memory cell 21, the cell current Icell depends on an On current Ion-F1 of the transmission transistor F1.

The On current Ion-F1 of the transmission transistor F1 depends on a threshold Vth of the transmission transistor F1. Variations of the threshold Vth are represented by Formula (1) below:

$$\sigma Vth = Avt/(W \times L)^{1/2} \quad (1)$$

Avt: Transistor specific coefficient
W: Channel width of transistor
L: Channel length of transistor
W×L: Channel area of transistor Avt is a device specific coefficient and is a fixed value decided by, for example, the process of device production, the thickness of the oxide film and the like. Further, Avt is substantially the same among devices formed by the same process. For example, devices formed from the same wafer have substantially the same Avt.

With development of devices having still finer structures, W and L (or a channel area) shown in Formula (1) have smaller values. For example, because the devices undergo increased sensitivity to precision of device manufacturing process, such as the transfer, etc., relative variations in W and L become larger. Therefore, variations of Vth increase with the progress of finer structures and, as a result, variations of Ion also increase.

Thus, the current Ion flowing through a transmission transistor varies with variations of Vth and thus, the bit line delay until a predetermined potential difference appears in a pair of bit lines after the rise of the word line voltage is different from the memory cell 21 to the memory cell 21.

Figure 4:
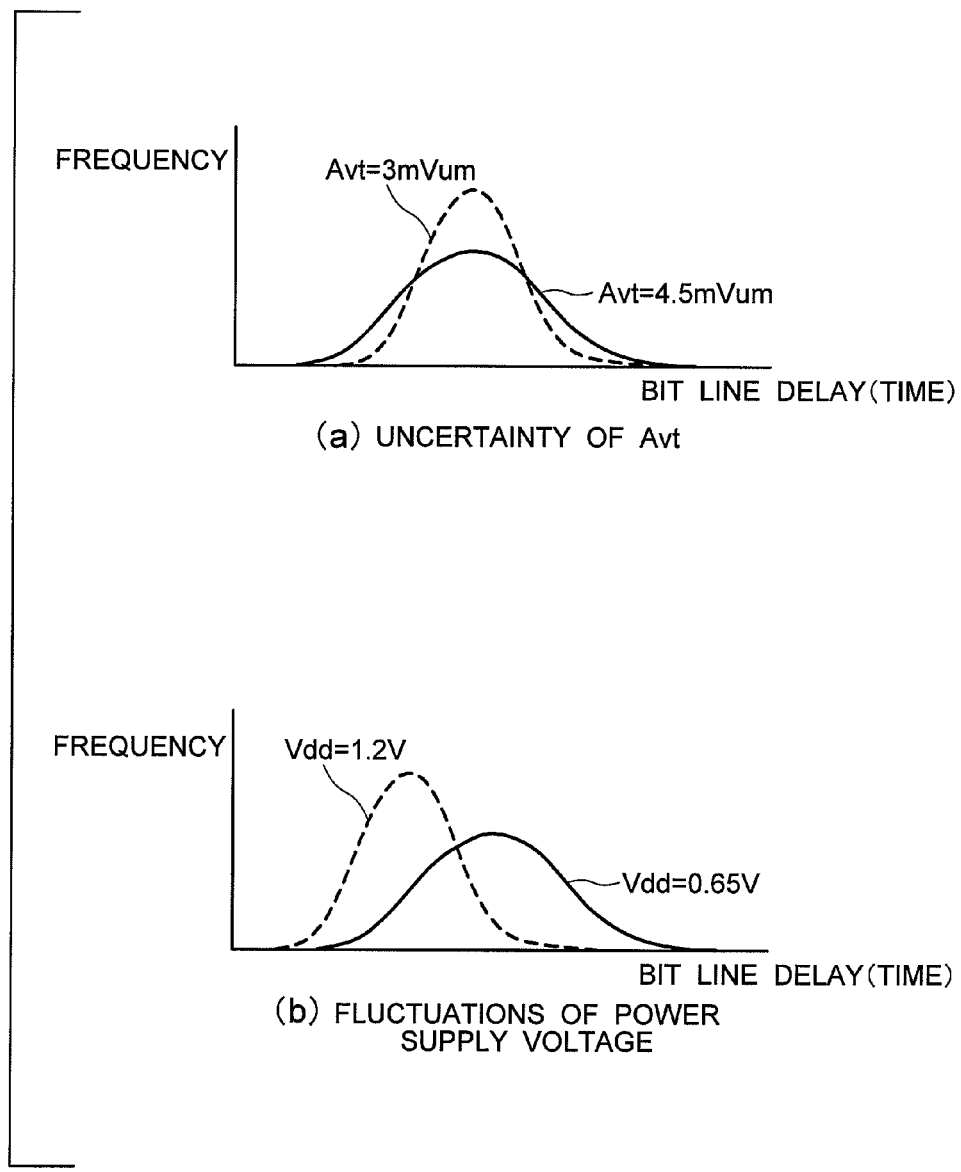
FIG. 4 is a diagram showing the distribution of bit line delay according to the first embodiment of the present invention.

FIG. 4 is a diagram showing the distribution of bit line delay according to the first embodiment of the present invention. FIG. 4(a) shows the distribution of bit line delay when Avt changes. FIG. 4(b) shows the distribution of bit line delay when the power supply voltage changes.

As shown in FIGS. 4(a), 4(b), the average value and the standard deviation σ (sigma) in the distribution of bit line delay change in accordance with changes of Avt or the power supply voltage.

In the present embodiment, it is assumed that the distribution of bit line delay has the shape of, for example, the normal distribution and does not change depending on Avt (magnitude of random variations) or the power supply voltage. As shown in FIGS. 4(a), 4(b), the distribution of bit line delay has a bell shape even if Avt or the power supply voltage changes and thus, this assumption is considered to be approximately correct.

Next, the timing generation circuit 10 will be described in detail. In the present embodiment, as an example, a case when the timing of the delay time positioned +2.5σ from the average value is selected from the distribution of bit line delay of a pair of bit line signals in which the potential difference of 300 mV appears when the power supply voltage VDD is 600 mV. However, +2.5σ is only an optimum value under conditions of the present embodiment. That is, if conditions change, for example, Avt or the power supply voltage VDD is different, the optimum value changes to, for example, +2σ or +1σ. When the timing of the delay time positioned other than +2.5σ is selected, the circuit configuration of the timing generation circuit 10 described below may be changed.

Figure 5:
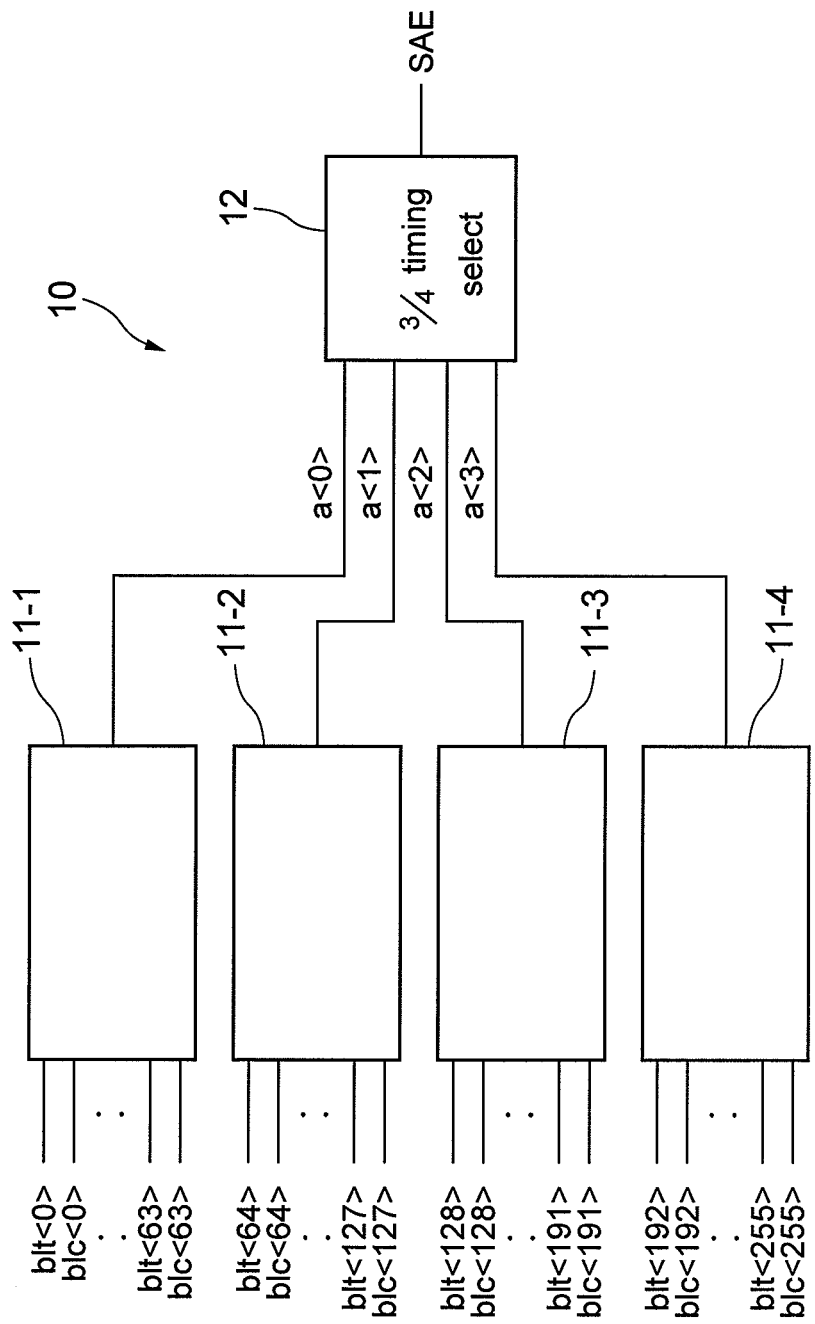
FIG. 5 is a block diagram showing the outline configuration of a timing generation circuit according to the first embodiment of the present invention.

FIG. 5 is a block diagram showing the outline configuration of a timing generation circuit according to the first embodiment of the present invention.

The timing generation circuit 10 includes 64/64 timing selection circuits (first timing selection circuits) 11-1 to 11-4 and a 3/4 timing selection circuit (second timing selection circuit) 12.

The 64/64 timing selection circuits 11-1 to 11-4 and a 3/4 timing selection circuit 12 function as timing selection circuits that select the timing in a preset order (in the present embodiment, the position of +2.5σ from the average value) from among timings in which each bit line signal of the plurality of bit lines blt<0> to blt<255> and blc<0> to blc<255> changes.

In other words, the 64/64 timing selection circuits 11-1 to 11-4 and the 3/4 timing selection circuit 12 function as timing selection circuits that select a timing in some order for each group from among the timings in which the plurality of bit line signals change, the timings being divided into a plurality of groups, and repeat, one or more times, a process of selecting a timing in some order for each group from among a predetermined number of timings divided into one group or more and selected immediately before, until the single timing is ultimately selected, and set the single timing ultimately selected as the timing in the preset order.

The 64/64 timing selection circuit 11-1 selects the latest timing from among timings of 128 bit line signals input from 64 pairs of bit lines blt<0> to blt<63> and blc<0> to blc<63> and outputs a signal a<0> having the selected timing. In the present embodiment, it is assumed that the timing when the potential difference of 300 mV appears in a pair of bit line signals can be selected. 300 mV corresponds to, for example, the threshold of a circuit when the power supply voltage VDD is 600 mV.

The 64/64 timing selection circuit 11-2 selects the latest timing from among timings of 128 bit line signals input from 64 pairs of bit lines blt<64> to blt<127> and blc<64> to blc<127> and outputs a signal a <1> having the selected timing.

The 64/64 timing selection circuit 11-3 selects the latest timing from among timings of 128 bit line signals input from 64 pairs of bit lines blt<128> to blt<191> and blc<128> to blc<191> and outputs a signal a<2> having the selected timing.

The 64/64 timing selection circuit 11-4 selects the latest timing from among timings of 128 bit line signals input from 64 pairs of bit lines blt<192> to blt<255> and blc<192> to blc<255> and outputs a signal a<3> having the selected timing.

The 3/4 timing selection circuit 12 outputs the sense amplifier enable signal SAE in the third earliest timing among timings in which the four signals a<0> to a<3> from the 64/64 timing selection circuits 11-1 to 11-4 change.

That is, the 64/64 timing selection circuits 11-1 to 11-4 select the Y (Y is a positive integer and 64 in the present embodiment)-th earliest timing for each group from among the timings in which the plurality of bit line signals change, and the timings are divided into X (X is an integer equal to 2 or greater and 4 in the present embodiment) groups in advance.

The 3/4 timing selection circuit 12 selects the Z (Z is a positive integer equal to X or less and 3 in the present embodiment)-th earliest timing from among the X selected Y-th earliest timings, as the timing in the preset order.

Then, the timing generation circuit 10 sets the timing in the preset order as activating timing and outputs the sense amplifier enable signal SAE whose signal level changes in the activating timing.

The sense amplifier enable signal SAE obtained in this way has the timing of the delay time positioned +2.5σ from the average value in the distribution of bit line delay of a pair of bit line signals in which the potential difference of 300 mV appears.

That the delay time in the position of +2.5σ can be obtained from such a selection algorithm can be verified by a numerical calculation.

Figure 6:
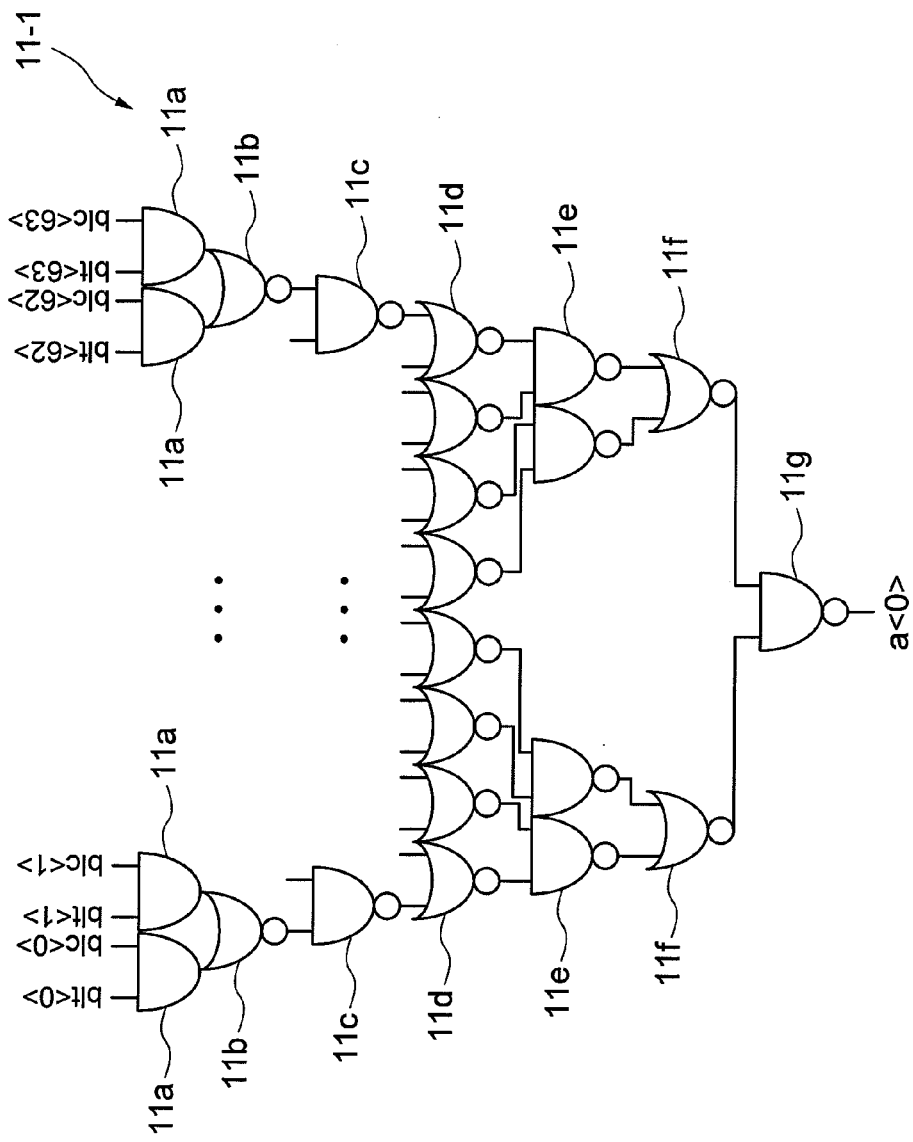
FIG. 6 is a circuit diagram showing the outline configuration of a 64/64 timing selection circuit according to the first embodiment of the present invention.

FIG. 6 is a circuit diagram showing the outline configuration of a 64/64 timing selection circuit according to the first embodiment of the present invention.

The 64/64 timing selection circuits 11-1 to 11-4 have the same configuration and thus, the 64/64 timing selection circuit 11-1 will be described.

The 64/64 timing selection circuit 11-1 includes 64 AND circuits 11a, 32 NOR circuits 11b, 16 NAND circuits 11c, eight NOR circuits 11d, four NAND circuits 11e, two NOR circuits 11f, and one NAND circuit 11g. In FIG. 6, portions of the AND circuits 11a, the NOR circuits 11b and the NAND circuits 11c are omitted to clarify the description.

A corresponding bit lines blt<0> to blt<63> are connected to one input terminal of each AND circuit 11a and a corresponding bit line blc<0> to blc<63> is connected to the other input terminal.

Two corresponding output terminals of the AND circuits 11a are connected to two input terminals of each NOR circuit 11b respectively.

Two corresponding output terminals of the NOR circuit 11b are connected to two input terminals of each NAND circuit 11c respectively.

Two corresponding output terminals of the NAND circuit 11c are connected to two input terminals of each NOR circuit 11d respectively.

Two corresponding output terminals of the NOR circuit 11d are connected to two input terminals of each NAND circuit 11e respectively.

Two corresponding output terminals of the NAND circuit 11e are connected to two input terminals of each NOR circuit 11f respectively.

Two output terminals of the NOR circuit 11f are connected to two input terminals of the NAND circuit 11g respectively and the signal a<0> is output from the output terminal thereof.

That is, each of bit lines blt<0> to blt<63> and blc<0> to blc<63> is connected to one of input terminals of the NAND circuit 11g via the AND circuits 11a, the NOR circuits 11b, the NAND circuits 11c, the NOR circuits 11d, the NAND circuits 11e, and the NOR circuits 11f.

When the voltage of one of a pair of bit lines in an initial state (voltage VDD) falls and the potential difference of 300 mV arises, each AND circuit 11a changes the output signal from a high level to a low level.

Each NOR circuit 11b changes the output signal from the low level to the high level in the later timing of timing when two output signals input from the AND circuit 11a change from the high level to the low level.

Similarly, the NAND circuit 11c, the NOR circuit 11d, the NAND circuit 11e, the NOR circuit 11f, and the NAND circuit 11g change an output signal in the later timing of timing when two input signals change logic.

Accordingly, as described above, the 64/64 timing selection circuit 11-1 selects the latest timing from among timings of 128 input bit line signals and outputs a signal a<0> whose logic changes in the selected timing.

Figure 7:
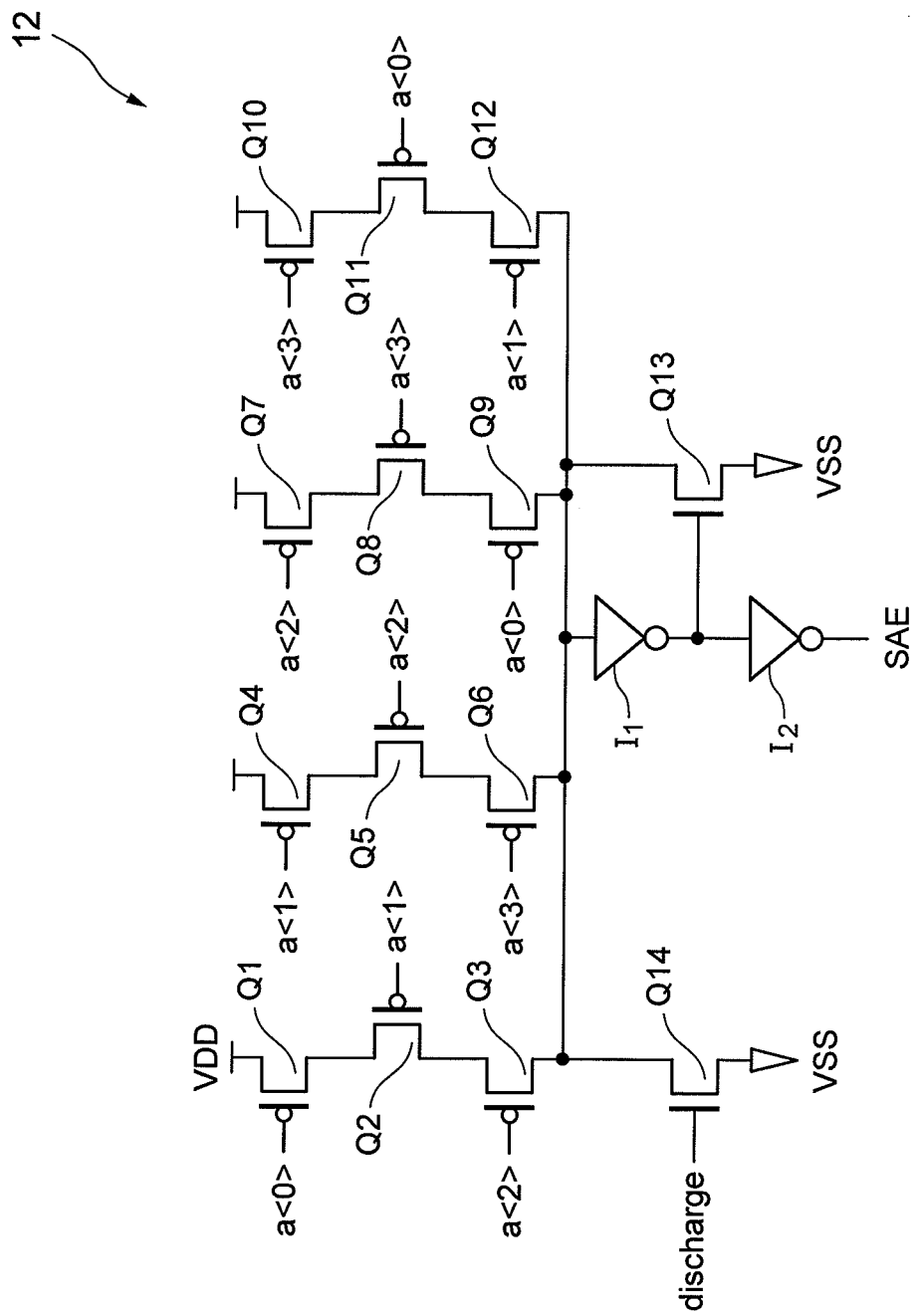
FIG. 7 is a circuit diagram showing the outline configuration of a 3/4 timing selection circuit according to the first embodiment of the present invention.

FIG. 7 is a circuit diagram showing the outline configuration of a 3/4 timing selection circuit according to the first embodiment of the present invention.

PMOS transistors Q1, Q2, and Q3 are connected in series between the power supply voltage VDD and an input terminal of an inverter I1. Signals a<0>, a<1>, and a<2> are input into gates of the PMOS transistors Q1, Q2, and Q3 respectively.

PMOS transistors Q4, Q5, and Q6 are connected in series between the power supply voltage VDD and the input terminal of the inverter I1. Signals a<1>, a<2>, and a<3> are input into gates of the PMOS transistors Q4, Q5, and Q6 respectively.

PMOS transistors Q7, Q8, and Q9 are connected in series between the power supply voltage VDD and the input terminal of the inverter I1. Signals a<2>, a<3>, and a<0> are input into gates of the PMOS transistors Q7, Q8, and Q9 respectively.

PMOS transistors Q10, Q11, and Q12 are connected in series between the power supply voltage VDD and the input terminal of the inverter I1. Signals a<3>, a<0>, and a<1> are input into gates of the PMOS transistors Q10, Q11, and Q12 respectively.

The output terminal of the inverter I1 is connected to the input terminal of an inverter I2. The inverter I2 outputs the sense amplifier enable signal SAE from the output terminal thereof.

An NMOS transistor Q13 has a drain connected to the input terminal of the inverter I1, a gate connected to the output terminal of the inverter I1, and a source connected to the ground voltage VSS.

An NMOS transistor Q14 has a drain connected to the input terminal of the inverter I1, a gate into which a signal discharge is input, and a source connected to the ground voltage VSS.

In the initial state, the signals a<0>, a<1>, a<2>, and a<3> and the signal discharge are at the high level. At this point, the NMOS transistor Q14 is On and the voltage of the input terminal of the inverter I1 is the ground voltage VSS. Thus, the NMOS transistor Q13 is On and the sense amplifier enable signal SAE is at the low level.

Here, a case when after the signal discharge falls to the low level, for example, the signals a<0>, a<1>, and a<2> fall to the low level from the high level successively and the signal a<3> maintains the high level will be considered. In this case, the PMOS transistors Q1, Q2, and Q3 are turned on in the timing when all the signals a<0>, a<1>, and a<2> fall to the low level and the voltage of the input terminal of the inverter I1 becomes the power supply voltage VDD. Thus, the sense amplifier enable signal SAE rises to the high level.

Accordingly, as described above, the 3/4 timing selection circuit 12 outputs the sense amplifier enable signal SAE in the third earliest timing among timings in which four signals a<0> to a<3> change.

Figure 8:
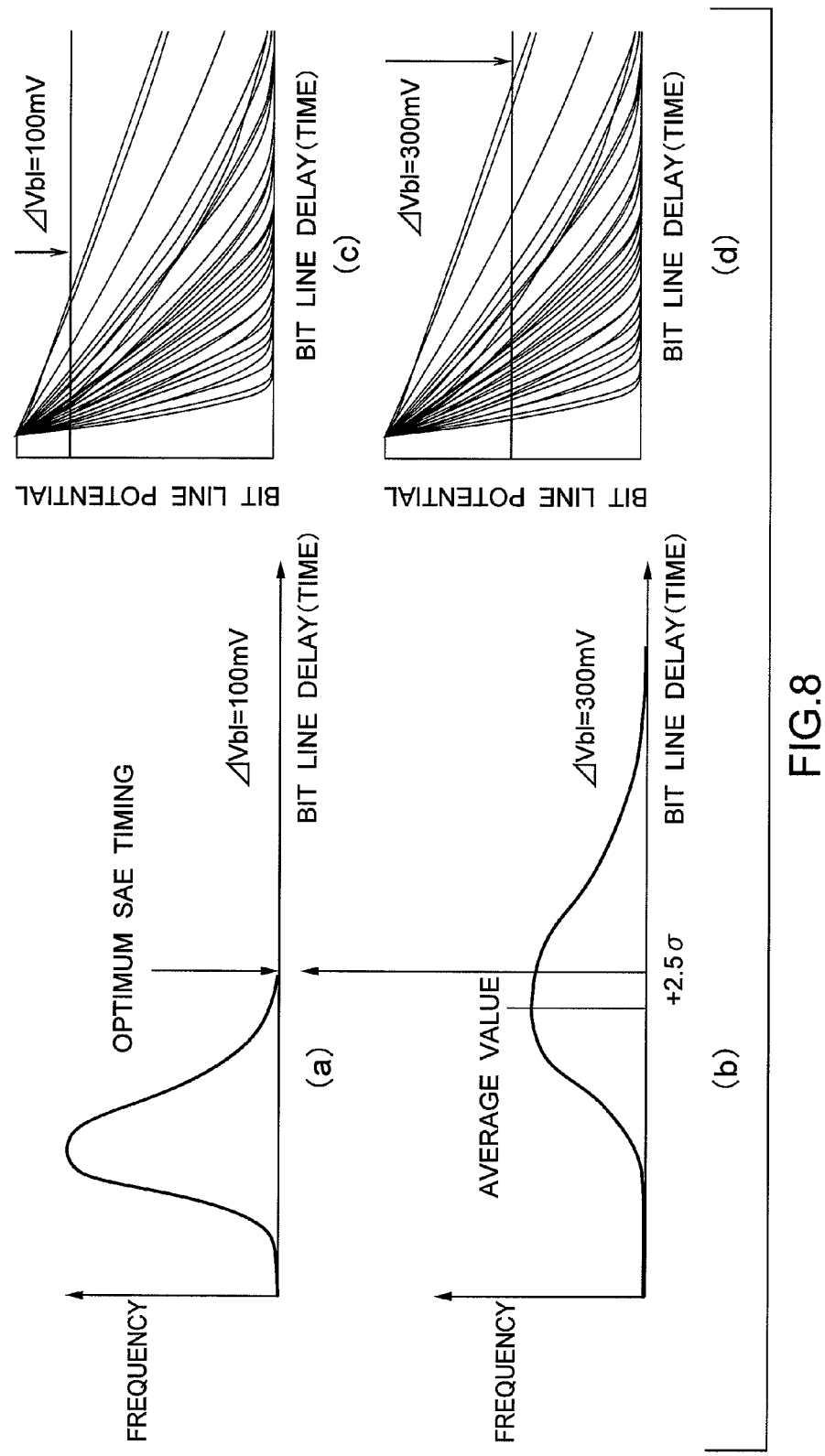
FIG. 8 is a diagram illustrating the principle of operation of the timing generation circuit according to the first embodiment of the present invention.

FIG. 8 is a diagram illustrating the principle of operation of the timing generation circuit according to the first embodiment of the present invention.

FIG. 8(a) is a diagram showing the distribution of bit line delay until the potential difference of 100 mV appears in a pair of bit lines in some selected row. FIG. 8(b) is a diagram showing the distribution of bit line delay until the potential difference of 300 mV appears in a pair of bit lines in the same row as in FIG. 8(a). FIGS. 8(c) and 8(d) are diagrams showing relationships between the bit line potential and bit line delay.

As shown in FIG. 8(a), the optimum timing of the sense amplifier enable signal SAE is the timing when the potential difference of 100 mV or more that can be detected by the sense amplifiers 30 appears in all pairs of bit lines. That is, the timing at the foot on the delay side of the distribution in FIG. 8(a) is optimal. This timing is the timing to be the worst value of the bit line delay in the whole semiconductor storage device 1.

The 64/64 timing selection circuits 11-1 to 11-4 of the timing generation circuit 10 receives, as described above, bit line signals through the AND circuits 11a. These AND circuits 11a need the potential difference of 300 mV or more between two input terminals to determine logic. The distribution of bit line delay in FIG. 8(b) under this condition is shifted more in the direction of delay than the distribution of bit line delay in FIG. 8(a).

As is evident from FIGS. 8(c) and 8(d), the voltage of the bit line and the bit line delay are roughly proportionate. Moreover, for example, the bit line delay corresponding to +2.5σ with respect to the average value in the distribution of bit line delay in FIG. 8(b) roughly corresponds to the maximum bit line delay of the whole semiconductor storage device 1 in the distribution of bit line delay in FIG. 8(a).

That is, if the timing corresponding to +2.5σ is selected in the distribution of bit line delay by the timing generation circuit 10, the timing becomes the timing of the approximately optimum sense amplifier enable signal SAE.

Even if the shape and position of the distribution of bit line delay change due to changes of Avt or fluctuations of the power supply voltage, if the timing corresponding to +2.5σ is selected by the timing generation circuit 10, the timing becomes the timing of the approximately optimum sense amplifier enable signal SAE.

In the present embodiment, it is assumed that the storage capacity of the semiconductor storage device 1 has a capacity value such that an end of the distribution of bit line delay of some selected row is near the worst value of the bit line delay in the whole semiconductor storage device 1. Accordingly, even if any row is selected, the timing near the worst value of the bit line delay in the whole semiconductor storage device 1 can be obtained by selecting the timing of +2.5σ in the distribution in each case. As an example, a case when the storage capacity is about several kbits and the worst value is accordingly positioned +4σ from the average value can be considered.

Next, the read operation of the semiconductor storage device 1 will be described.

Figure 9:
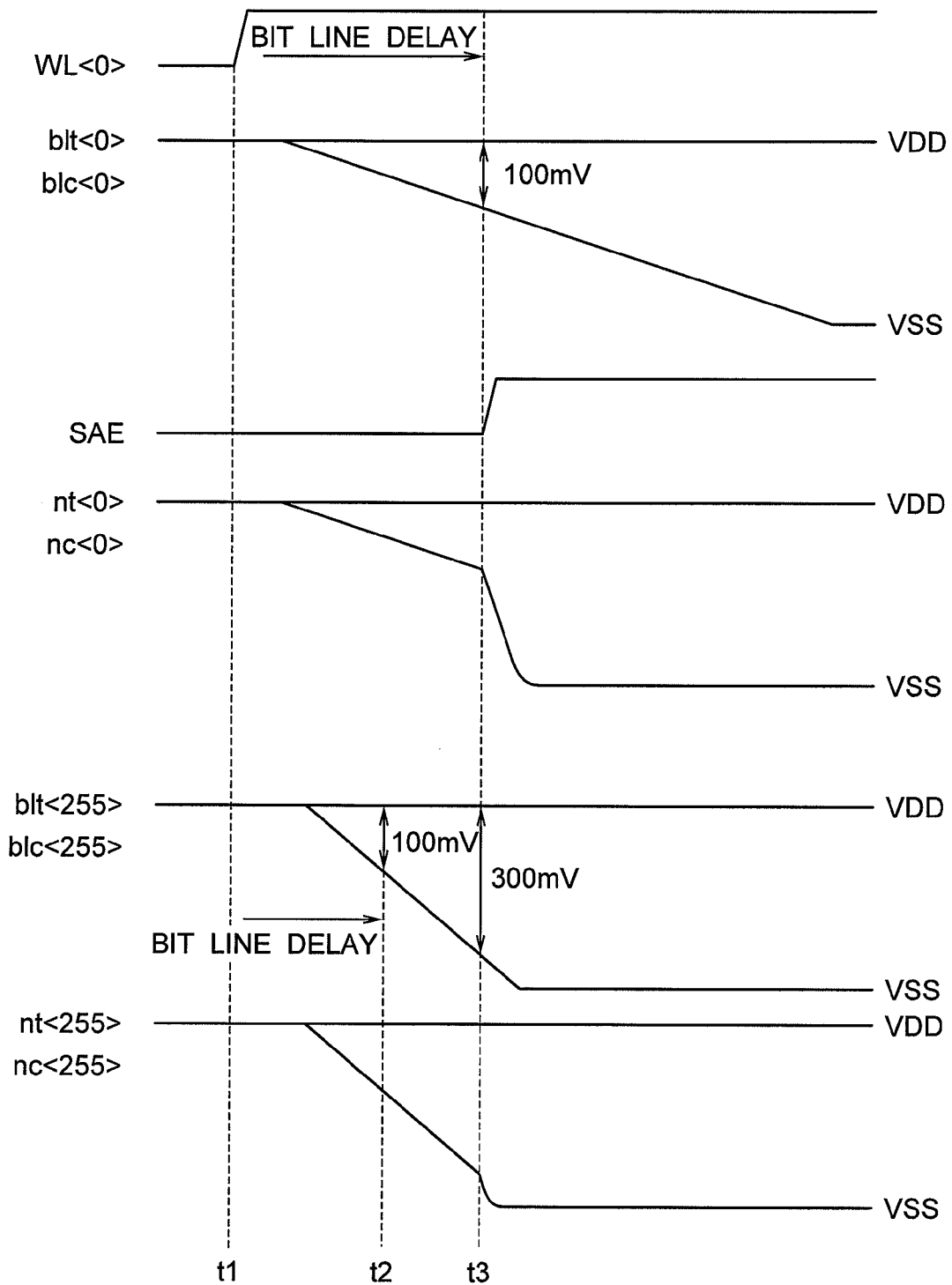
FIG. 9 is a diagram illustrating the operation of the semiconductor storage device according to the first embodiment of the present invention.

FIG. 9 is a diagram illustrating the operation of the semiconductor storage device according to the first embodiment of the present invention.

First, the bit lines blt<0> to blt<255> and blc<0> to blc<255> are precharged. Then, the row is selected by a row decoder (not shown) and, for example, the selected word line WL<0> is driven.

The memory cell 21 connected to the bit lines blt<0> and blc<0> will be described. If the voltage of the word line WL<0> is raised at time t1, the transmission transistors F1, F2 enter a saturation region and the storage nodes n, nb are conducting to the bit lines blt<0> and blc<0> in the memory cell 21. Then, when the storage nodes n, nb are conducting to the bit lines blt<0> and blc<0>, voltages of the bit lines blt<0> and blc<0> change in accordance with voltages of the storage nodes n, nb and data stored in the selected memory cell 21 flows to the bit lines blt<0> and blc<0> as the cell current Icell. If the voltage of the storage node n is higher than the voltage of the storage node nb, the voltage of the bit line blc<0> falls from the initial state (voltage VDD) by 100 mV at time t3 so as to be detectable by the sense amplifiers 30. The time interval between time t1 and time t3 is the bit line delay of the memory cell 21. It is assumed here that the bit line delay of the memory cell 21 is the latest of all bit line delays of the whole semiconductor storage device 1.

Next, the memory cell 21 connected to the bit lines blt<255> and blc<255> will be described. If the voltage of the word line WL<0> is raised at time t1, the memory cell 21 operates as described above. Then, if the voltage of the storage node n is higher than the voltage of the storage node nb, the voltage of the bit line blc<255> falls from the initial state by 100 mV at time t2 so as to be detectable by the sense amplifiers 30. The time interval between time t1 and time t2 is the bit line delay until the potential difference of 100 mV in the memory cell 21 appears. At time t3, the voltage of the bit line blc<255> falls from the initial state by 300 mV. It is assumed here that the bit line delay until the potential difference of 300 mV in the memory cell 21 appears corresponds, in the distribution (FIG. 8(b)) of bit line delay until the potential difference of 300 mV appears, to the delay time in the position of +2.5σ from the average value.

The memory cell 21 connected to other bit lines operates in the same manner and a description thereof is not repeated here.

Based on the selection algorithm described above, the timing generation circuit 10 selects the timing in the position of +2.5σ from the average value from the distribution of bit line delay until the potential difference of 300 mV appears. That is, in this example, the timing generation circuit 10 selects the timing of the bit line blc<255> and raises the sense amplifier enable signal SAE to the high level at time t3. At time t3, as described above, the potential difference of 100 mV detectable by the sense amplifiers 30 appears even in the bit lines blt<0> and blc<0> having the latest bit line delay.

When the sense amplifier enable signal SAE is raised to the high level, the cell current Icell flows into each of the sense amplifiers 30 and also each of the sense amplifiers 30 operates and detects the current output from these memory cells 21 to perform a so-called detection operation. Accordingly, the voltage of a node nt<0> of the sense amplifier 30 connected to the bit line blt<0> does not change from VDD and the voltage of a node nc<0> connected to the bit line blc<0> changes to VSS. Also, the voltage of a node nt<255> of the sense amplifier 30 connected to the bit line blt<255> does not change from VDD and the voltage of a node nc<255> connected to the bit line blc<255> changes to VSS. This also applies to the sense amplifiers 30 connected to other bit lines.

If another row (word line) is selected, like the above description, the timing generation circuit 10 selects the timing in the position of +2.5σ from the average value in the distribution in each case and activates the sense amplifiers 30 in the selected timing. Though the distribution changes slightly depending on the selected row, the timing selected by the timing generation circuit 10 is approximately the same as time t3 described above.

That is, data can be read from all the memory cells 21 in the optimum timing.

Thus, according to the present embodiment, the timing in the position of +2.5σ from the average value is selected from among timings in which each bit line signal in a plurality of bit lines changes by 300 mV, and the sense amplifiers 30 are activated in the selected timing. Accordingly, the sense amplifiers 30 can be activated in the timing in which the potential difference (100 mV) detectable by the sense amplifiers 30 appears in bit lines having the latest bit line delay.

Therefore, even if the distribution of bit line delay changes due to changes of random variations or fluctuations of power supply voltage, the sense amplifiers 30 can always be activated in the optimum timing. Thus, data can be read from all the memory cells 21 appropriately without unnecessary timing margins. Accordingly, lower operating frequencies or increased power consumption of the semiconductor storage device 1 can be prevented.

That is, the sense amplifiers 30 can be activated in the timing of the latest bit line delay among bit line delays actually occurring in the semiconductor storage device 1.

Next, before starting the description of a second embodiment, a case when the storage capacity of the semiconductor storage device 1 is larger than in the first embodiment will be described. That is, in the following example, the number of rows (number m of word lines) is larger than in the first embodiment. The storage capacity is assumed to be a capacity value such that the end of the distribution of bit line delay of some selected row is apart from the worst value of the bit line delay in the whole semiconductor storage device 1. As an example, a case when the storage capacity is about several hundred Mbits and the worst value is accordingly positioned +6σ from the average value can be considered.

First, a case when the power supply voltage VDD is 600 mV, which is the same as in the first embodiment, will be described.

The distribution of bit line delay of some selected row represents only a very small portion of the distribution of bit line delay of the whole semiconductor storage device 1. Thus, as shown in FIG. 10(a), the distribution of bit line delay until the potential difference of 100 mV appears in a pair of bit lines in some selected row is unevenly located in positions where the delay time is shorter than the position of +6σ.

Figure 10:
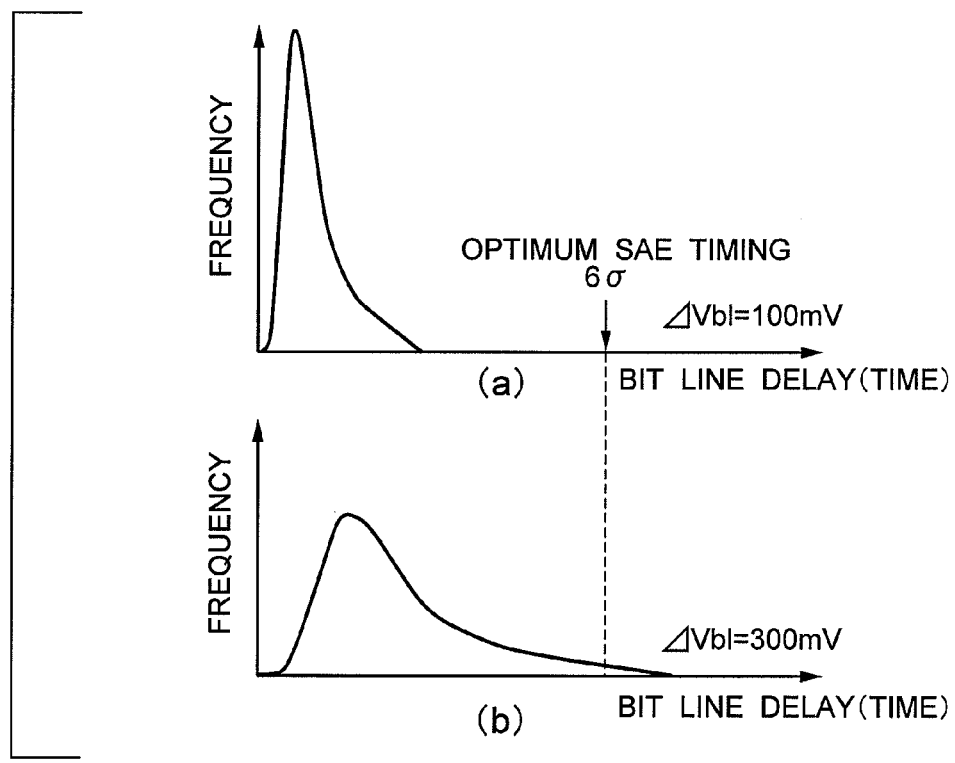
FIG. 10 is a diagram showing the distribution of bit line delays when the storage capacity of the semiconductor storage device is large and the power supply voltage is high.

Even in this case, the timing in the position of +6σ is present, as shown in FIG. 10(b), in the distribution of bit line delay until the potential difference of 300 mV appears in a pair of bit lines of the row, and therefore, the optimum timing can be generated by the timing generation circuit 10 in the first embodiment. However, it is necessary to change the selection algorithm of the timing generation circuit 10 in the first embodiment.

Next, a case when the power supply voltage VDD is lower than in the first embodiment, for example, 400 mV will be described.

Figure 11:
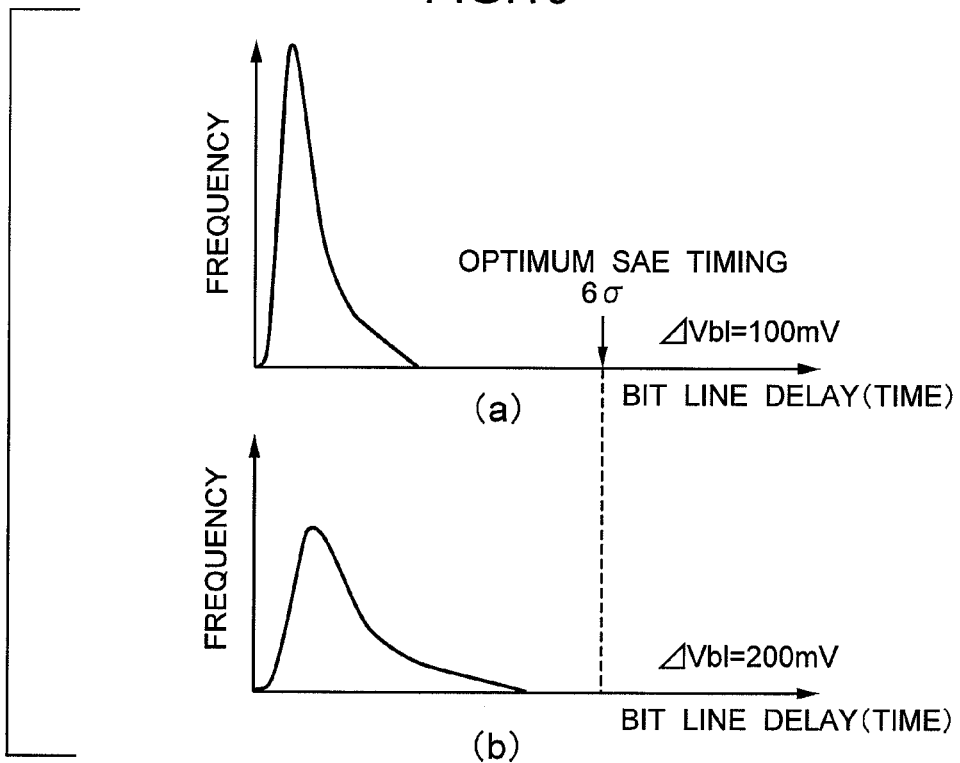
FIG. 11 is a diagram showing the distribution of bit line delays when the storage capacity of the semiconductor storage device is large and the power supply voltage is low.

If the power supply voltage VDD is 400 mV, a potential difference ΔVbl of a pair of bit lines detectable in the timing generation circuit 10 is 200 mV. Thus, the difference from the ΔVbl (100 mV) of a pair of bit lines detectable by the sense amplifiers 30 becomes smaller. Then, as shown in FIGS. 11(a) and 11(b), the difference between both distributions becomes smaller and the timing in the position of +6σ from the average value in the distribution of all bit line delays in the semiconductor storage device 1 is not present in the distribution of bit line delay until the potential difference of 200 mV appears in a pair of bit lines. FIG. 11(a) shows the same distribution as the distribution in FIG. 10(a).

Even if the timing in the position of +6σ is contained in the distribution of bit line delay in FIG. 11(b), the number of samples is small. If the number of samples is small, the timing changes noticeably in accordance with the selected row, leading to a greater error.

Thus, to make an error for each row smaller, it is necessary to select the timing in a position where there is a certain number of samples. Therefore, for example, only the timing in the position of +2.5σ or so in the distribution in FIG. 11(b) can be obtained. This timing corresponds to the bit line delay of a shorter time than the timing in the position of +6σ in the distribution in FIG. 11(a).

Thus, with an increasing storage capacity of the semiconductor storage device 1, desired timing may not be generated using the timing generation circuit 10 in the first embodiment.

The second embodiment described below can deal with such a case.

Second Embodiment

The present embodiment relates to a semiconductor storage device in which the configuration of the timing generation circuit is different from that in the first embodiment.

In the semiconductor storage device 1 according to the present embodiment, the circuit configuration is the same as that in the first embodiment of FIG. 1 excluding a timing generation circuit 10a. Thus, the same reference numerals are attached to the same structural elements and the illustration and description thereof are not repeated here. However, it is assumed, as described above, that storage capacity (number m of word lines) of the semiconductor storage device 1 is larger than in the first embodiment. The storage capacity is like the above example described with reference to FIG. 10(a) and is assumed to be a capacity value whose worst value of the bit line delay in the whole semiconductor storage device 1 is positioned such as +6σ from the average value.

In the present embodiment, as an example, a case when the timing of a bit line delay 1T and the timing of a bit line delay 1.5T are selected from the distribution of bit line delay in which the potential difference of 200 mV appears in a pair of bit line signals when the power supply voltage VDD is 400 mV and, based on the above timing, the timing corresponding to +6σ (bit line delay 4T) is generated. However, also in the present embodiment, like in the first embodiment, the above bit line delays 1T, 1.5T, and 4T and the worst value +6σ of the bit line delay are optimum values under conditions of the present embodiment and if conditions change such as the storage capacity, Avt, or power supply voltage VDD is different, optimum values change to other values. To select the timing of other delay times than the above times, the circuit configuration of the timing generation circuit 10a described below may be changed.

Figure 12:
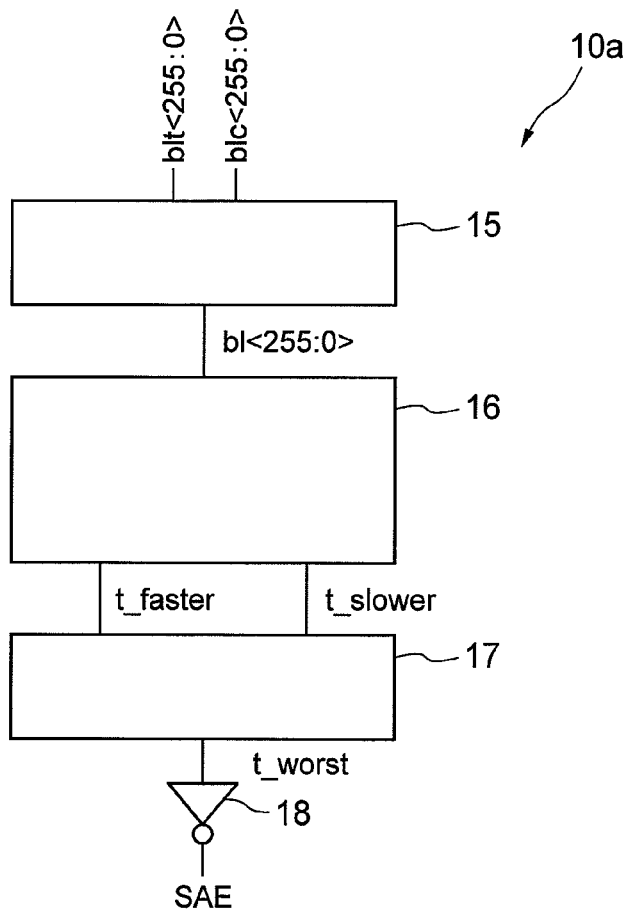
FIG. 12 is a block diagram showing the outline configuration of the timing generation circuit according to the second embodiment of the present invention.

FIG. 12 is a block diagram showing the outline configuration of the timing generation circuit according to the second embodiment of the present invention.

The timing generation circuit 10a includes a signal input circuit 15, a timing selection circuit 16, and a timing multiplier (timing computing unit) 17.

The signal input circuit 15 into which bit line signals are input from the bit lines blt<0> to blt<255> and blc<0> to blc<255> outputs signals bl<255:0> to the timing selection circuit 16. The timing selection circuit 16 outputs a timing signal t_faster and a timing signal t_slower to the timing multiplier 17. The timing multiplier 17 outputs a timing signal t_worst to an inverter 18 and the inverter 18 outputs the sense amplifier enable signal SAE.

Figure 13:
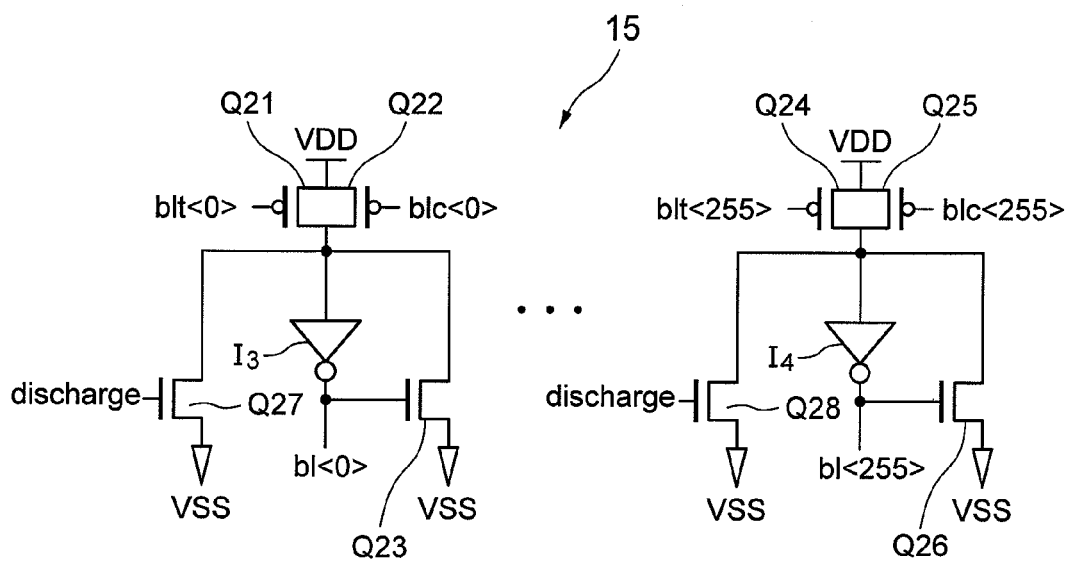
FIG. 13 is a circuit diagram showing the outline configuration of a signal input circuit according to the second embodiment of the present invention.

FIG. 13 is a circuit diagram showing the outline configuration of a signal input circuit according to the second embodiment of the present invention.

PMOS transistors Q21, Q22 have sources connected to the power supply voltage VDD and drains connected to the input terminal of an inverter I3. The bit line blt<0> is connected to the gate of the PMOS transistor Q21 and the bit line blc<0> is connected to the gate of the PMOS transistor Q22.

An NMOS transistor Q23 has a drain connected to the input terminal of the inverter I3, a gate connected to the output terminal of the inverter I3, and a source connected to the ground voltage VSS. An NMOS transistor Q27 has a drain connected to the input terminal of the inverter I3, a gate into which the signal discharge is input, and a source connected to the ground voltage VSS. The inverter I3 outputs a signal bl<0>.

The signal input circuit 15 has 256 circuits configured as described above.

That is, PMOS transistors Q24, Q25, NMOS transistors Q26, Q28, and an inverter I4 constituting the 256-th circuit have similar connections.

Accordingly, in the timing in which after the signal discharge changes from the high level to the low level, one bit line signal of bit line signals of a pair of bit lines blt<0> and blc<0> falls from VDD by, for example, 300 mV, the signal input circuit 15 changes the signal bl<0> from the high level to the low level. Bit line signals of other bit lines operate similarly to output signals bl<1> to bl<255>.

Figure 14:
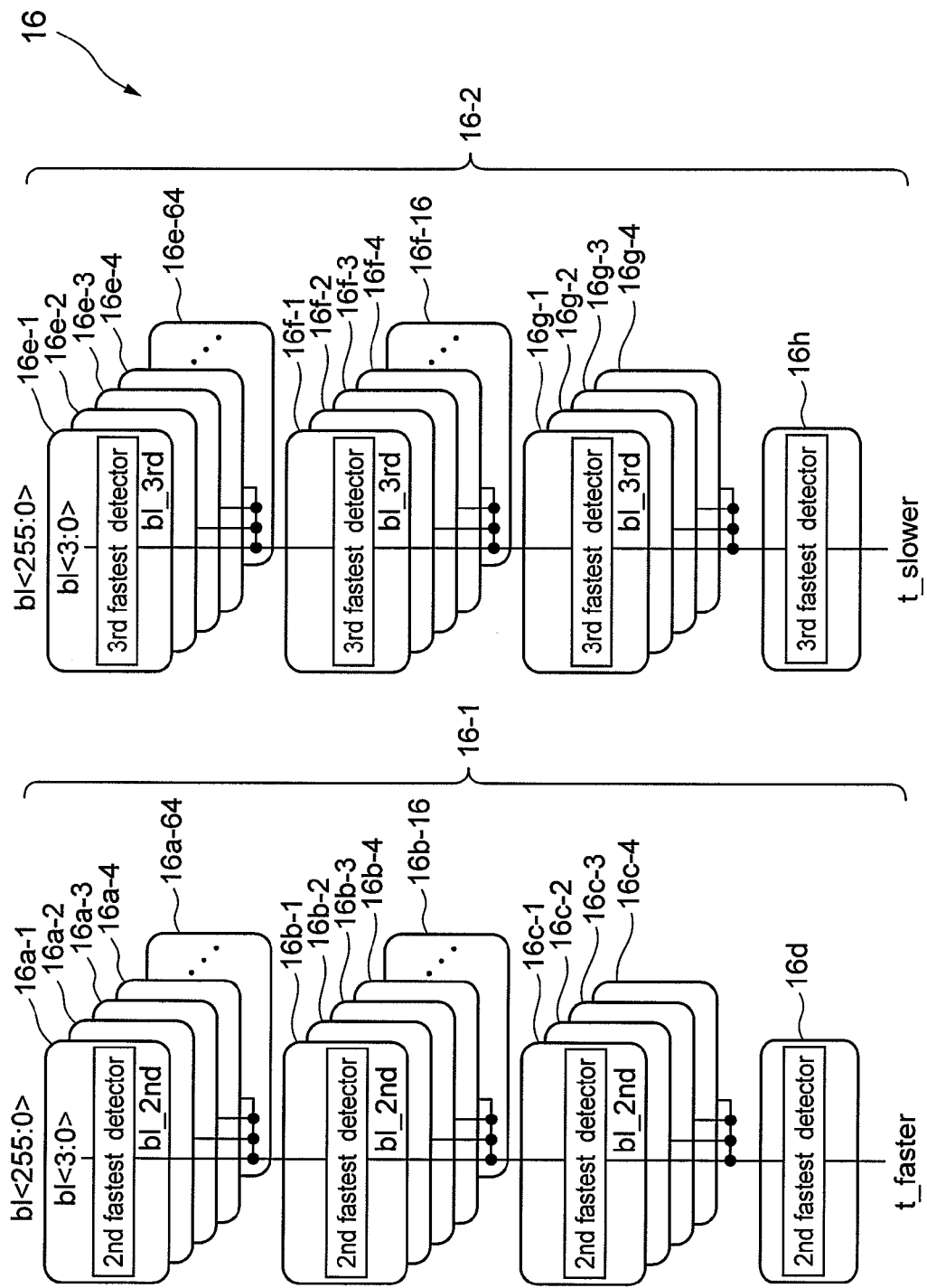
FIG. 14 is a block diagram showing the outline configuration of the timing selection circuit according to the second embodiment of the present invention.

FIG. 14 is a block diagram showing the outline configuration of the timing selection circuit according to the second embodiment of the present invention.

The timing selection circuit 16 includes a third timing selection circuit 16-1 and a fourth timing selection circuit 16-2.

First, the third timing selection circuit 16-1 will be described.

256 signals bl<255:0> are divided into 64 groups with four signals in each group. Four signals in each group are input into corresponding 2/4 timing selection circuits 16a-1 to 16a-64. For example, four signals bl<3:0> are input into the 2/4 timing selection circuit 16a-1. Four signals bl<7:4> are input into the 2/4 timing selection circuit 16a-2. Four signals bl<11:8> are input into the 2/4 timing selection circuit 16a-3. Four signals bl<15:12> are input into the 2/4 timing selection circuit 16a-4. Other signals are also input in the same manner.

Each of the 2/4 timing selection circuits 16a-1 to 16a-64 outputs the signal in the second earliest timing of four input signals.

64 signals output from each of the 2/4 timing selection circuits 16a-1 to 16a-64 are divided into 16 groups with four signals in each group. Four signals in each group are input into corresponding 2/4 timing selection circuits 16b-1 to 16b-16.

Each of the 2/4 timing selection circuits 16b-1 to 16b-16 outputs the signal in the second earliest timing of four input signals.

16 signals output from each of the 2/4 timing selection circuits 16b-1 to 16b-16 are divided into four groups with four signals in each group. Four signals in each group are input into corresponding 2/4 timing selection circuits 16c-1 to 16c-4.

Each of the 2/4 timing selection circuits 16c-1 to 16c-4 outputs the signal in the second earliest timing of four input signals.

Four signals output from each of the 2/4 timing selection circuits 16c-1 to 16c-4 are input into a 2/4 timing selection circuit 16d.

The 2/4 timing selection circuit 16d outputs the signal in the second earliest timing of four input signals as the timing signal t_faster having the timing in the first preset order. The timing in the first preset order corresponds to the bit line delay time 1T. T herein represents a preset time.

That is, the third timing selection circuit 16-1 selects a timing in some order for each group from among the timings in which the plurality of bit line signals change, the timings being divided into a plurality of groups, and repeats, one or more times, a process of selecting a timing in some order for each group from among a predetermined number of timings divided into one group or more and selected immediately before, until the single timing is ultimately selected, and sets the single timing ultimately selected as the timing in a first preset order.

In other words, the third timing selection circuit 16-1 selects the B (B is a positive integer less than A and 2 in the present embodiment)-th earliest timing from among timings in which each bit line signal changes, in each group formed of A (A is an integer equal to 2 or greater and 4 in the present embodiment) bit line signals of a plurality of bit line signals, and repeats the process of selecting the B-th earliest timing for each group formed of A signals of a plurality of the selected B-th earliest timings, until the single B-th earliest timing is selected, and sets the single B-th earliest timing ultimately selected as the timing in the first preset order.

Next, the fourth timing selection circuit 16-2 will be described.

The fourth timing selection circuit 16-2 is a circuit obtained by replacing the 2/4 timing selection circuits 16a-1 to 16a-64, 16b-1 to 16b-16, 16c-1 to 16c-4, and 16d of the third timing selection circuit 16-1 with 3/4 timing selection circuits 16e-1 to 16e-64, 16f-1 to 16f-16, 16g-1 to 16g-4, and 16h.

That is, four signals of each of 64 groups obtained by distributing four signals of 256 signals bl<255:0> to each group are input into the corresponding 3/4 timing selection circuits 16e-1 to 16e-64. Each of the 3/4 timing selection circuits 16e-1 to 16e-64 outputs the signal of the third earliest timing of four input signals.

64 signals output from each of the 3/4 timing selection circuits 16e-1 to 16e-64 are divided into 16 groups with four signals in each group. Four signals in each group are input into the corresponding 3/4 timing selection circuits 16f-1 to 16f-16.

Each of the 3/4 timing selection circuits 16f-1 to 16f-16 outputs the signal of the third earliest timing of four input signals. 16 signals output from each of the 3/4 timing selection circuits 16f-1 to 16f-16 are divided into four groups with four signals in each group. Four signals in each group are input into the corresponding 3/4 timing selection circuits 16g-1 to 16g-4.

Each of the 3/4 timing selection circuits 16g-1 to 16g-4 outputs the signal of the third earliest timing of four input signals.

Four signals output from each of the 3/4 timing selection circuits 16g-1 to 16g-4 are input into the 3/4 timing selection circuit 16h.

The 3/4 timing selection circuit 16h outputs the signal in the third earliest timing of four input signals as the timing signal t_slower having the second preset order. The timing in the second preset order corresponds to the bit line delay time 1.5T. As for the timing of the first and second preset order, how many σ they correspond to and how much bit line delay time they correspond to is decided in accordance with the storage capacity or the like.

That is, the fourth timing selection circuit 16-2 selects a timing in some order for each group from among the timings in which the plurality of bit line signals change, the timings being divided into a plurality of groups, and repeats, one or more times, the process of selecting a timing in some order for each group from among a predetermined number of timings divided into one group or more and selected immediately before, until the single timing is ultimately selected, and sets the single timing ultimately selected, later than the timing in the first preset order, as the timing in a second preset order.

In other words, the fourth timing selection circuit 16-2 selects the C (C is an integer greater than B and equal to or less than A and 3 in the present embodiment)-th earliest timing from among timings in which each bit line signal changes, in each group formed of A (A is an integer equal to 2 or greater and 4 in the present embodiment) bit line signals of a plurality of bit line signals, and repeats the process of selecting the C-th earliest timing for each group formed of A signals of a plurality of the selected C-th earliest timings, until the single C-th earliest timing is ultimately selected, and sets the single C-th earliest timing ultimately selected as the timing in the second preset order.

Figure 15:
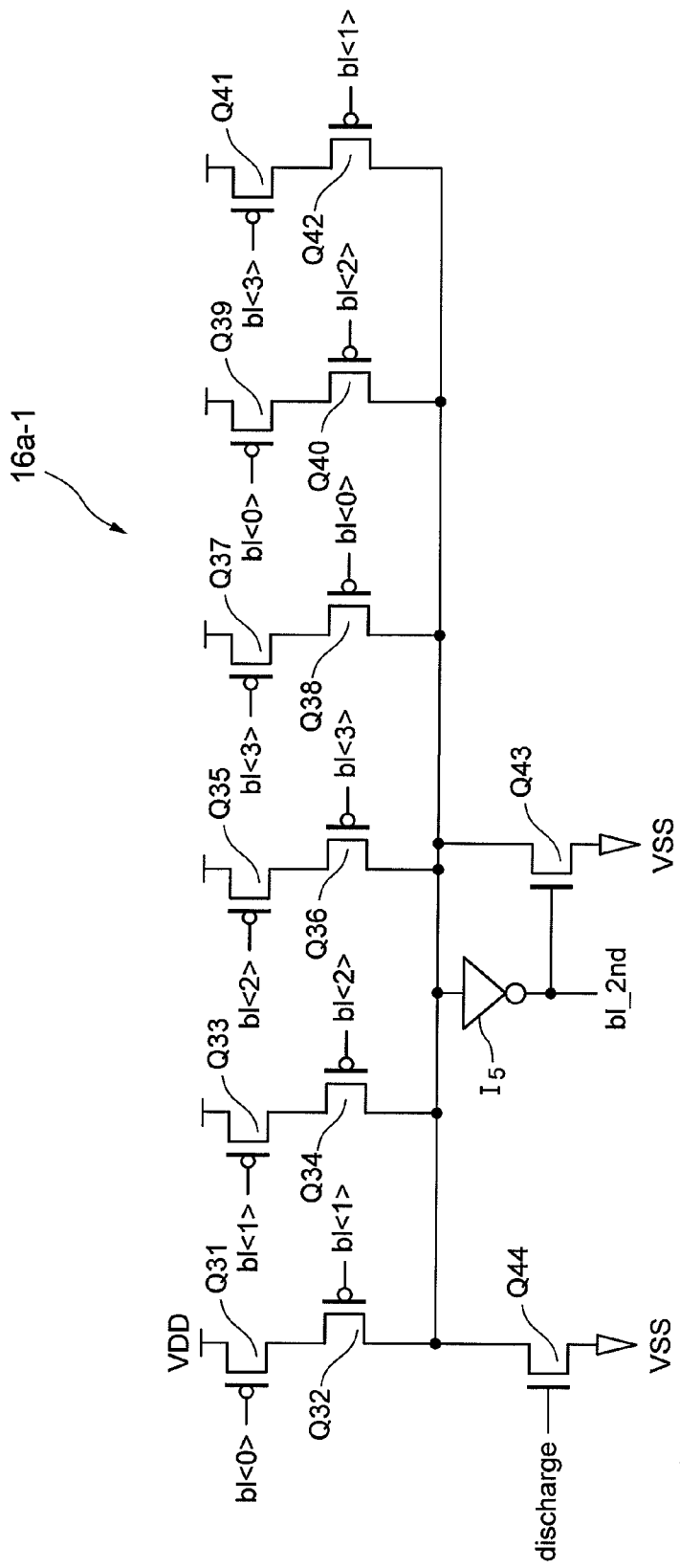
FIG. 15 is a circuit diagram showing the outline configuration of the 2/4 timing selection circuit according to the second embodiment of the present invention.

FIG. 15 is a circuit diagram showing the outline configuration of the 2/4 timing selection circuit according to the second embodiment of the present invention.

The 2/4 timing selection circuit 16a-1 will be described. Other 2/4 timing selection circuits have the same circuit configuration, but input/output signals are different.

PMOS transistors Q31, Q32 are connected in series between the power supply voltage VDD and the input terminal of an inverter I5. Signals bl<0> and bl<1> are input into gates of the PMOS transistors Q31, Q32 respectively.

PMOS transistors Q33, Q34 are connected in series between the power supply voltage VDD and the input terminal of the inverter I5. Signals bl<1> and bl<2> are input into gates of the PMOS transistors Q33, Q34 respectively.

PMOS transistors Q35, Q36 are connected in series between the power supply voltage VDD and the input terminal of the inverter I5. Signals bl<2> and bl<3> are input into gates of the PMOS transistors Q35, Q36 respectively.

PMOS transistors Q37, Q38 are connected in series between the power supply voltage VDD and the input terminal of the inverter I5. Signals bl<3> and bl<0> are input into gates of the PMOS transistors Q37, Q38 respectively.

PMOS transistors Q39, Q40 are connected in series between the power supply voltage VDD and the input terminal of the inverter I5. Signals bl<0> and bl<2> are input into gates of the PMOS transistors Q39, Q40 respectively.

PMOS transistors Q41, Q42 are connected in series between the power supply voltage VDD and the input terminal of the inverter I5. Signals bl<3> and bl<1> are input into gates of the PMOS transistors Q41, Q42 respectively.

The inverter I5 outputs a signal bl_2nd from the output terminal thereof.

A NMOS transistor Q43 has a drain connected to the input terminal of the inverter I5, a gate connected to the output terminal of the inverter I5, and a source connected to the ground voltage VSS.

An NMOS transistor Q44 has a drain connected to the input terminal of the inverter I5, a gate into which the signal discharge is input, and a source connected to the ground voltage VSS.

In the initial state, the signals bl<0>, bl<1>, bl<2>, and bl<3> and the signal discharge are at the high level. At this point, the transistor Q44 is On and the voltage of the input terminal of the inverter I5 is the ground voltage VSS. Thus, the NMOS transistor Q43 is On and the signal bl_2nd is at the high level.

Here, a case when after the signal discharge falls to the low level, for example, the signals bl<0> and bl<1> fall to the low level from the high level successively and the signals bl<2> and bl<3> maintain the high level will be considered. In this case, the PMOS transistors Q31 and Q32 are turned on in the timing when all the signals bl<0> and bl<1> fall to the low level and the voltage of the input terminal of the inverter I5 becomes the power supply voltage VDD. Thus, the signal bl_2nd falls to the low level.

Thus, the 2/4 timing selection circuit 16a-1 changes the signal bl_2nd in the second earliest timing among timings in which four signals bl<0> to bl<3> change.

Figure 16:
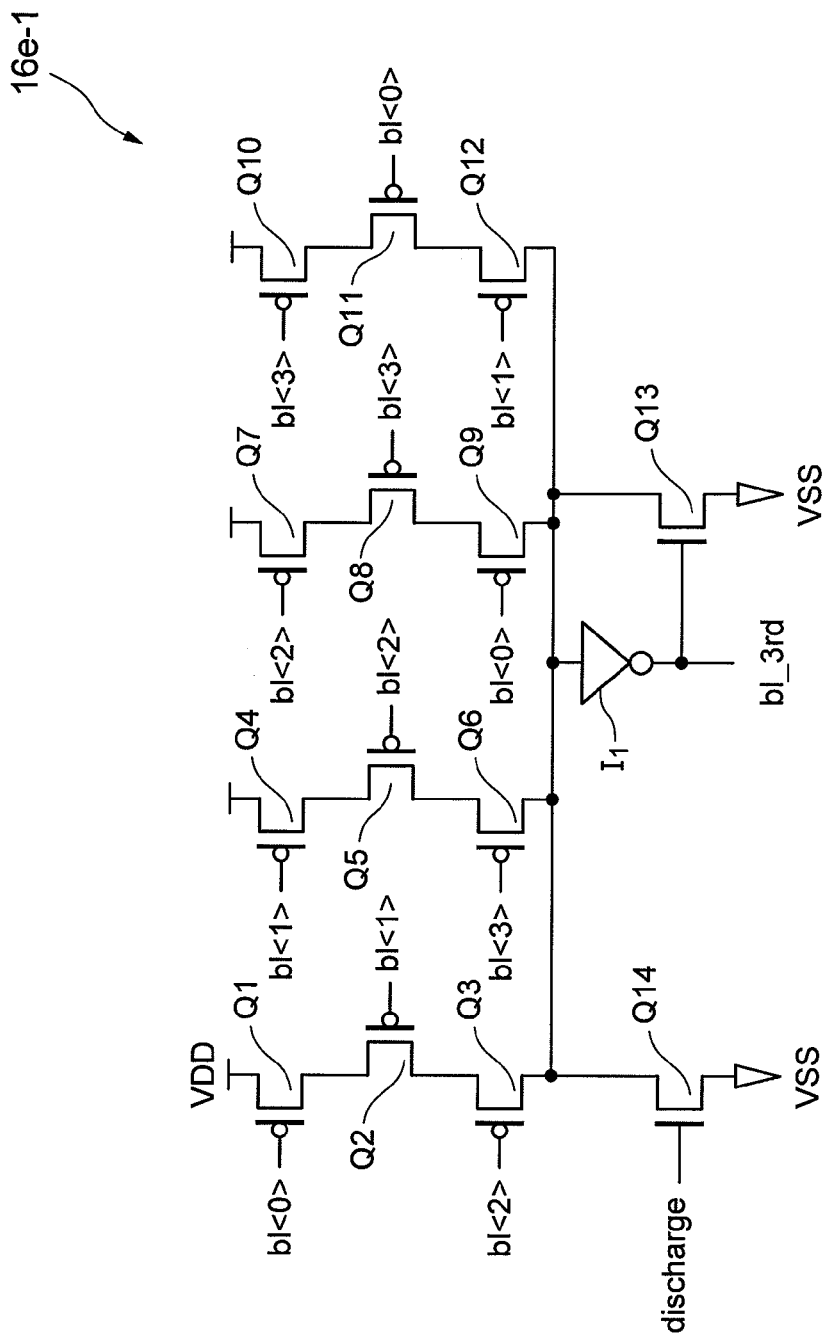
FIG. 16 is a circuit diagram showing the outline configuration of the 3/4 timing selection circuit according to the second embodiment of the present invention.

FIG. 16 is a circuit diagram showing the outline configuration of the 3/4 timing selection circuit according to the second embodiment of the present invention.

Each of the 3/4 timing selection circuits 16e-1 to 16e-64, 16f-1 to 16f-16, 16g-1 to 16g-4, and 16h has a configuration obtained by removing the inverter I2 from the 3/4 timing selection circuit 12 shown in FIG. 7 in the first embodiment. Thus, the same reference numerals are attached to the same structural elements and a detailed description thereof is not repeated here.

Figure 17:
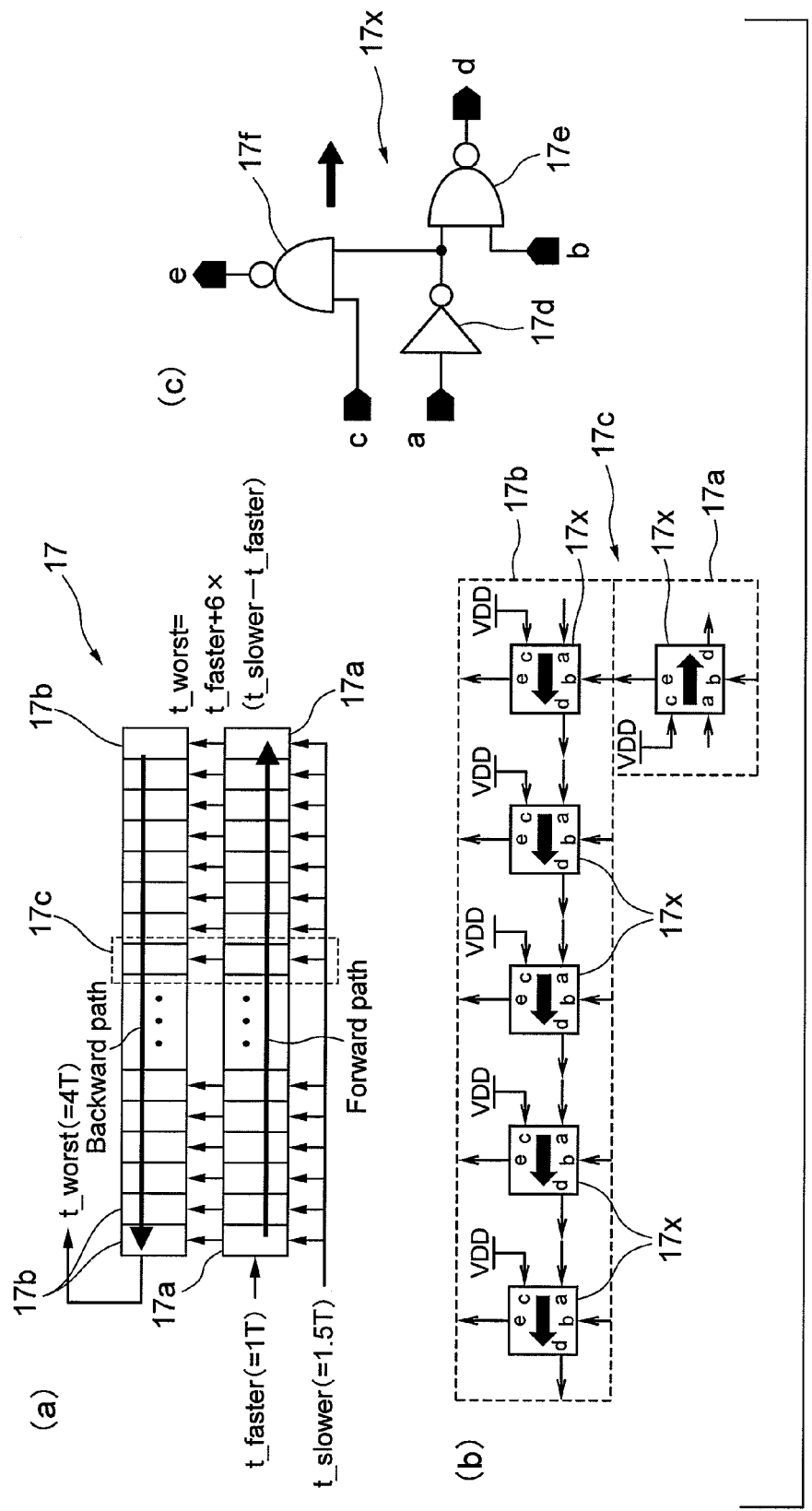
FIG. 17 is a block diagram showing the outline configuration of a timing multiplier according to the second embodiment of the present invention.

FIG. 17 is a block diagram showing the outline configuration of a timing multiplier according to the second embodiment of the present invention.

As shown in FIG. 17(*a*), a timing multiplier includes a plurality of first delay circuits 17a constituting a forward path and connected in series, and a plurality of second delay circuits 17b constituting a backward path and connected in series. The backward path transmits a signal in a direction opposite to the forward path. The first delay circuits 17a and the second delay circuits 17b are provided in a one-to-one correspondence and in equal numbers. A pair of the first delay circuit 17a and the second delay circuit 17b constitutes a delay unit 17c.

As shown in FIG. 17(*b*), the first delay circuit 17a includes a unit delay circuit 17x and the second delay circuit 17b includes the five unit delay circuits 17x (first to fifth). That is, the second delay circuit 17b has five times the delay time of the first delay circuit 17a.

In the first delay circuit 17a, an input terminal a of the unit delay circuit 17x receives a signal from the unit delay circuit 17x of the preceding first delay circuit 17a, the timing signal t_slower is input into an input terminal b, and the power supply voltage VDD is input to an input terminal c. An output terminal d of the unit delay circuit 17x outputs a signal to the unit delay circuit 17x of the subsequent first delay circuit 17a and an output terminal e is connected to the input terminal b of the first unit delay circuit 17x of the second delay circuit 17b in the delay unit 17c.

In the second delay circuit 17b, the input terminal a of the first unit delay circuit 17x receives a signal from the fifth unit delay circuit 17x of the preceding second delay circuit 17b. The input terminal a of the second to fifth unit delay circuits 17x is connected to the output terminal d of the immediately preceding unit delay circuit 17x. The output terminal d of the fifth unit delay circuit 17x outputs a signal to the first unit delay circuits 17x of the subsequent second delay circuit 17b. The power supply voltage VDD is input to the input terminal c of each unit delay circuit 17x and the output terminal e thereof is open. The input terminal b of the second to fifth unit delay circuits 17x is open.

The unit delay circuit 17x has the configuration shown in FIG. 17(c). That is, the input terminal a is connected to the input terminal of an inverter 17d. The output terminal of the inverter 17d is connected to one input terminal of a NAND circuit 17e and one input terminal of a NAND circuit 17f. The other input terminal of the NAND circuit 17e is connected to the input terminal b. The output terminal of the NAND circuit 17e is connected to the output terminal d. The other input terminal of the NAND circuit 17f is connected to the input terminal c. The output terminal of the NAND circuit 17f is connected to the output terminal e.

The timing signal t_faster input into the initial first delay circuit 17a in the forward path is delayed by the respective first delay circuits 17a. Then, when the timing signal t_faster is in the same timing as the timing signal t_slower after being delayed by the n first delay circuits 17a by a delay time t, the timing signal t_faster delayed by the delay time t is input into the corresponding second delay circuit 17b in the backward path.

That is, the delay time t is the difference between the timing signal t_faster and the timing signal t_slower.

The timing signal t_faster delayed by the delay time t is turned around to travel in the direction opposite to the direction of the forward path, that is, the direction of the backward direction and delayed by the n second delay circuits 17b of the plurality of second delay circuits 17b before being output as a timing signal t_worst having activation timing.

Therefore, the timing signal t_faster delayed by the delay time t is further delayed by the delay time 5t in the backward path.

Accordingly, the timing signal t_worst becomes t_worst=t_faster+6×(t_slower−t_faster). As described above, the timing signal t_faster has the bit line delay 1T and the timing signal t_slower has the bit line delay 1.5T. Therefore, timing signal t_worst has the bit line delay time 4T.

Thus, the timing multiplier 17 subtracts the timing in the first preset order from the timing in the second preset order, multiplies the subtraction result by an integer, and adds the result multiplied by the integer to the timing in the first preset order to output the addition result as the activation timing.

The inverter 18 inverts the signal t_worst from the timing multiplier 17 to output the sense amplifier enable signal SAE.

Figure 18:
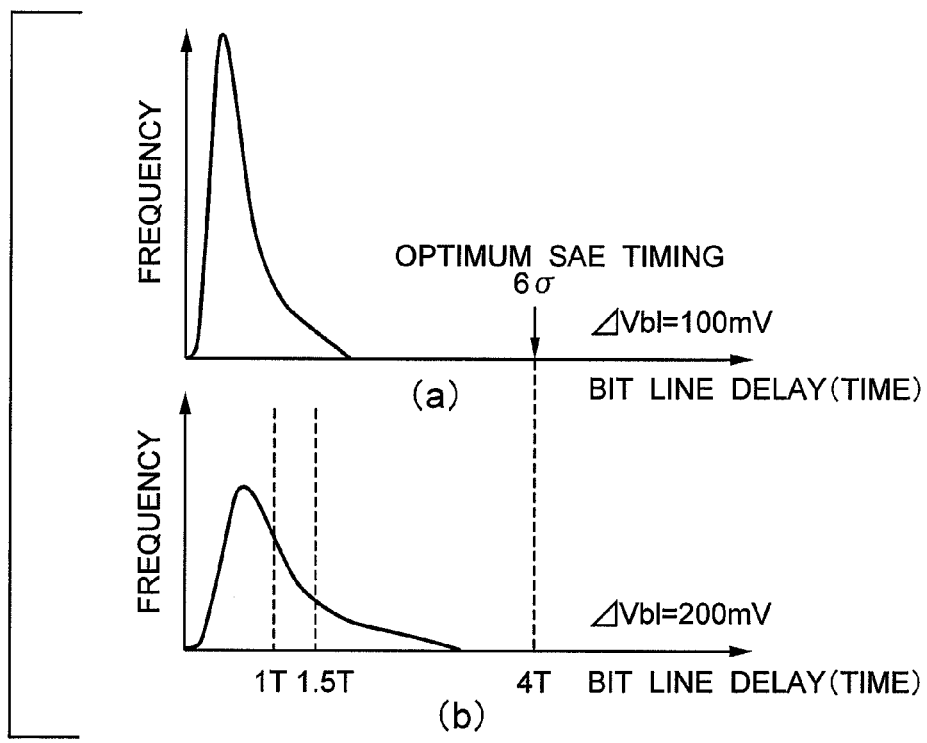
FIG. 18 is a diagram illustrating the operation of the timing generation circuit according to the second embodiment of the present invention.

FIG. 18 is a diagram illustrating the operation of the timing generation circuit according to the second embodiment of the present invention.

If, as shown in FIG. 18(b), the timing (bit line delay 1T) in the first preset order and the timing (bit line delay 1.5T) in the second preset order in the distribution of bit line delay of some selected row are selected and the timing (bit line delay 4T) corresponding to +6σ is calculated based on the above timing as described above by the timing generation circuit 10a, as shown in FIG. 18(a), the timing becomes the timing of the optimum sense amplifier enable signal SAE that takes all bit line delays of the semiconductor storage device 1 into consideration.

Thus, according to the present embodiment, the timing in the first preset order and the timing in the second preset order are selected from timing in which the signal of each bit line in a plurality of bit lines changes and the timing of +6σ is generated based on the selected two timings to activate the sense amplifiers 30 in the timing. Accordingly, even if the storage capacity is large or the power supply voltage VDD is low, the sense amplifiers 30 can be activated in the timing in which the potential difference detectable by the sense amplifiers 30 appears in bit line having the latest bit line delay.

Therefore, even if the distribution of bit line delay changes due to changes of random variations or fluctuations of power supply voltage, the sense amplifiers 30 can always be activated in the optimum timing. Thus, data can be read from all the memory cells 21 appropriately without unnecessary timing margins. Accordingly, lower operating frequencies or increased power consumption of the semiconductor storage device 1 can be prevented.

That is, the sense amplifiers 30 can be activated in the timing of the latest bit line delay among bit line delays actually occurring in the semiconductor storage device 1.

According to the embodiments described above, a timing generation circuit capable of generating the optimum timing and a semiconductor storage device using the timing generation circuit can be provided.

The above embodiments can be modified in various ways. An example of modification will be described below with reference to drawings. In the drawings using in the following description, the same reference numerals are attached to the corresponding portions used in the above embodiments to omit a duplicate description.

Modification of the Second Embodiment

The present modification has a different timing generation circuit 10b from the timing generation circuit 10a in the second embodiment.

It is assumed that the storage capacity of the semiconductor storage device 1 and the power supply voltage VDD are the same as those in the second embodiment.

Also in the present modification, like the first and second embodiments, the delay time 2T and the delay time 4T described below are optimum values under conditions of the present modification and optimum values change to other values when Avt or the power supply voltage VDD is different.

Figure 19:
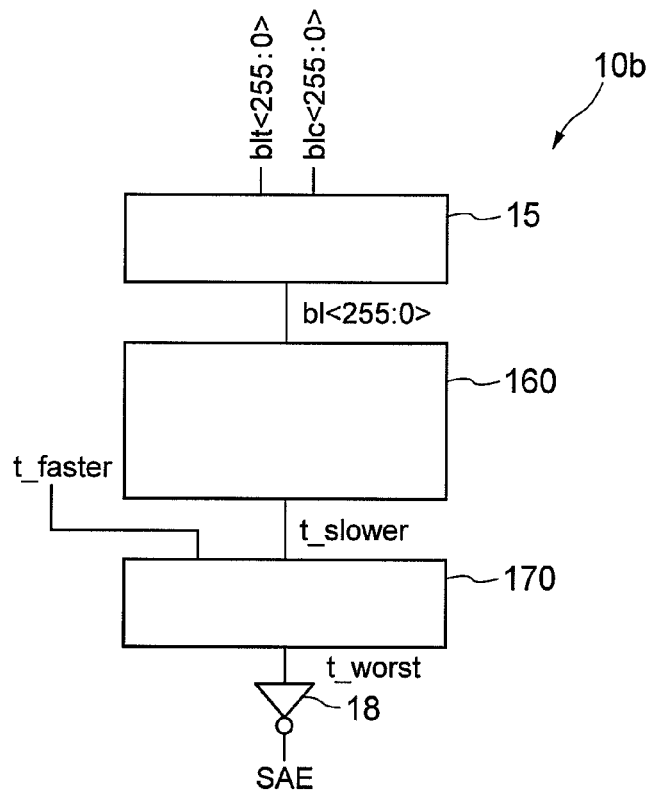
FIG. 19 is a block diagram showing the outline configuration of the timing generation circuit according to a modification of the second embodiment of the present invention.

FIG. 19 is a block diagram showing the outline configuration of the timing generation circuit according to a modification of the second embodiment of the present invention.

In the timing generation circuit 10b, a timing selection circuit 160 and a timing multiplier 170 are different from the second embodiment. That the timing signal t_faster input into the timing multiplier 170 has timing in which the signal of a selected word line changes is also different from the second embodiment. Thus, the bit line delay of the timing signal t_faster in the present modification is 0.

The timing selection circuit 160 selects the timing in a preset order from among timings in which each bit line signal of the plurality of bit lines blt<0> to blt<255> and blc<0> to blc<255> changes and outputs the timing signal t_slower having the timing. In the present embodiment, the timing in the preset order corresponds to the bit line delay time 2T. As described above, the circuit configuration of the timing selection circuit 160 is decided by a numerical calculation so that the timing in the preset order can be selected.

Figure 20:
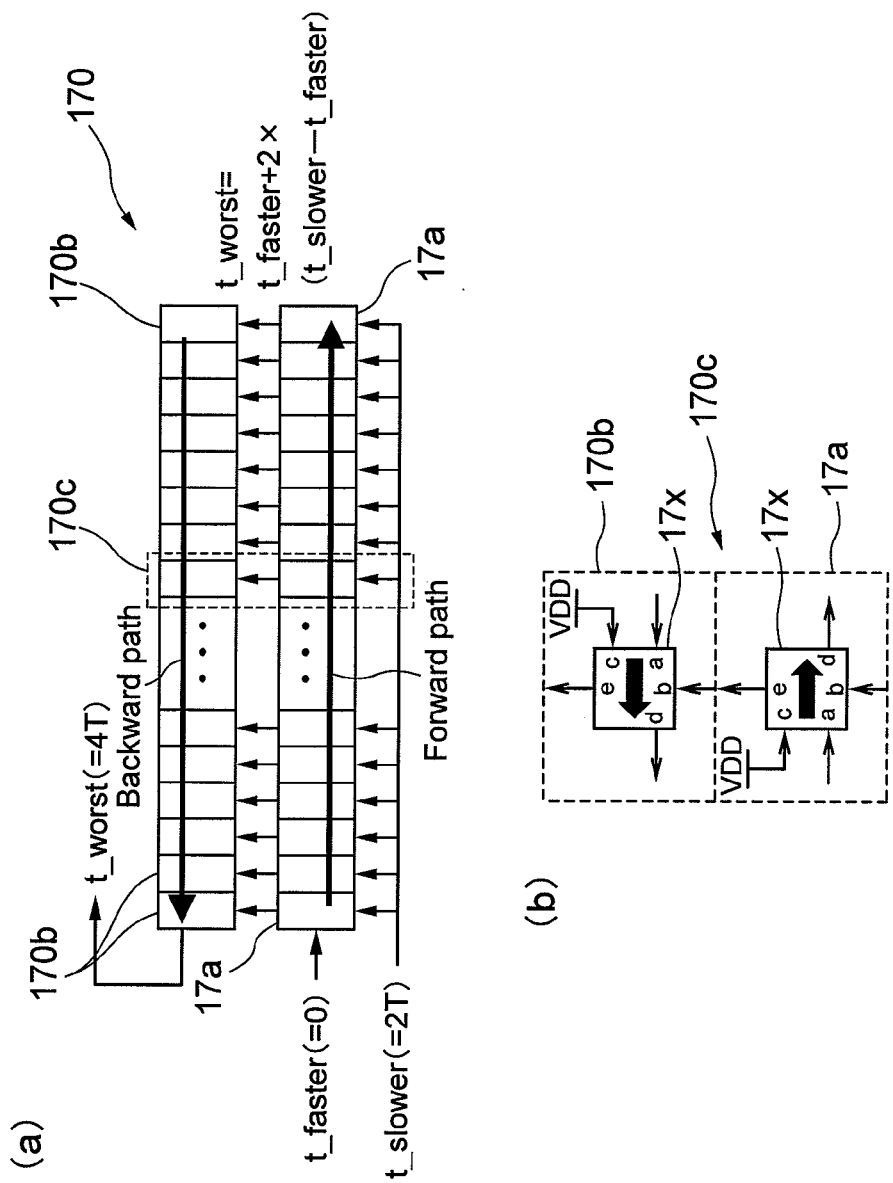
FIG. 20 is a block diagram showing the outline configuration of the timing multiplier according to the modification of the second embodiment of the present invention.

FIG. 20 is a block diagram showing the outline configuration of the timing multiplier according to the modification of the second embodiment of the present invention.

In the timing multiplier 170, the circuit configuration of a second delay circuit 170b constituting a delay unit 170c is different from that of the timing multiplier 17 in the second embodiment. That is, the second delay circuit 170b has one unit delay circuit 170x.

With this configuration, the timing signal t_worst is calculated as t_worst=t_faster+2×(t_slower−t_faster). As described above, the timing signal t_faster has the bit line delay 0 and the timing signal t_slower has the bit line delay 2T. Therefore, the timing signal t_worst has the bit line delay 4T.

Thus, the timing multiplier 170 subtracts the timing in which a signal of a word line changes from the timing in the preset order, multiplies the subtraction result by an integer, and adds the result multiplied by the integer to the timing in which the signal of the word line changes, to output the addition result as the activation timing.

Figure 21:
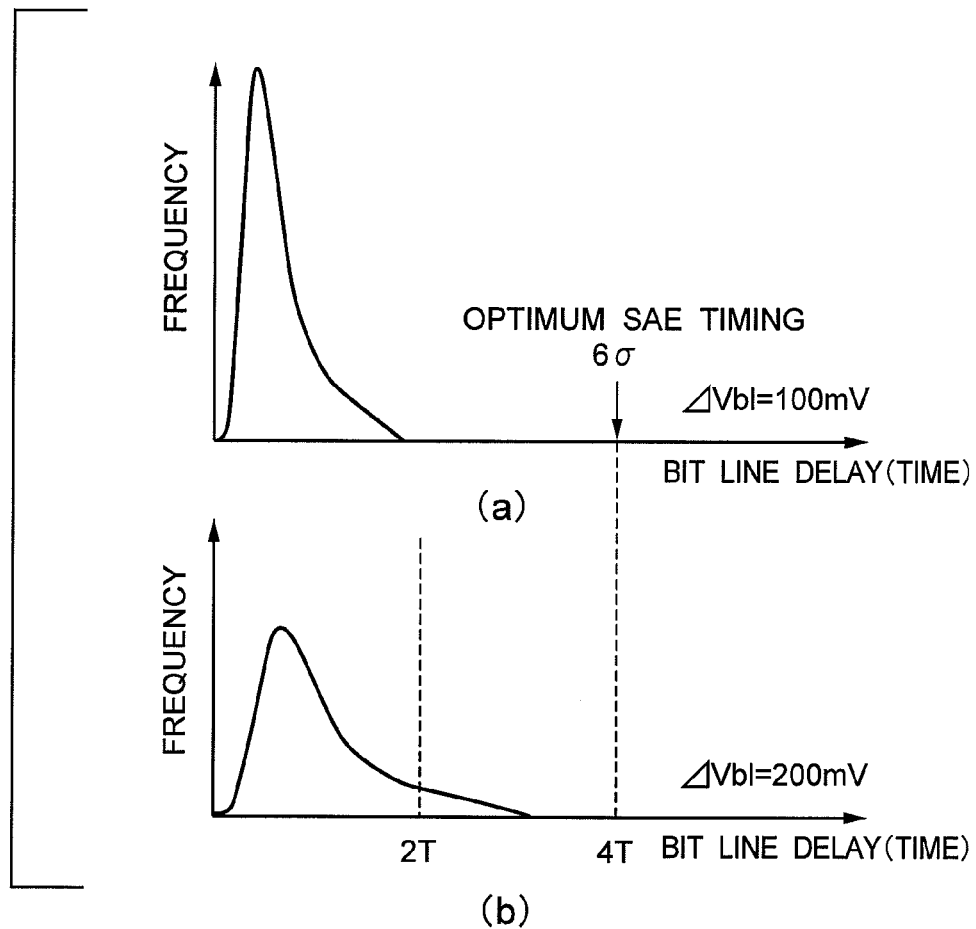
FIG. 21 is a diagram illustrating the operation of the timing generation circuit according to the modification of the second embodiment of the present invention.

FIG. 21 is a diagram illustrating the operation of the timing generation circuit according to the modification of the second embodiment of the present invention.

If, as shown in FIG. 21(b), the timing (bit line delay 2T) in the preset order in the distribution of bit line delay of some selected row is selected and the timing (bit line delay 4T) corresponding to +6σ is calculated based on the above timing and the timing (bit line delay 0) in which a signal of the selected word line changes as described above by the timing generation circuit 10b, as shown in FIG. 21(a), the timing becomes the timing of the optimum sense amplifier enable signal SAE that takes all bit line delays of the semiconductor storage device 1 into consideration.

That is, according to the present modification, the same effect as that of the second embodiment can be obtained.
(Modification of the 3/4 Timing Selection Circuit)

The 3/4 timing selection circuit 12 as configured in FIG. 7 may be configured as described below. This circuit can be configured without using the signal discharge.

Figure 22:
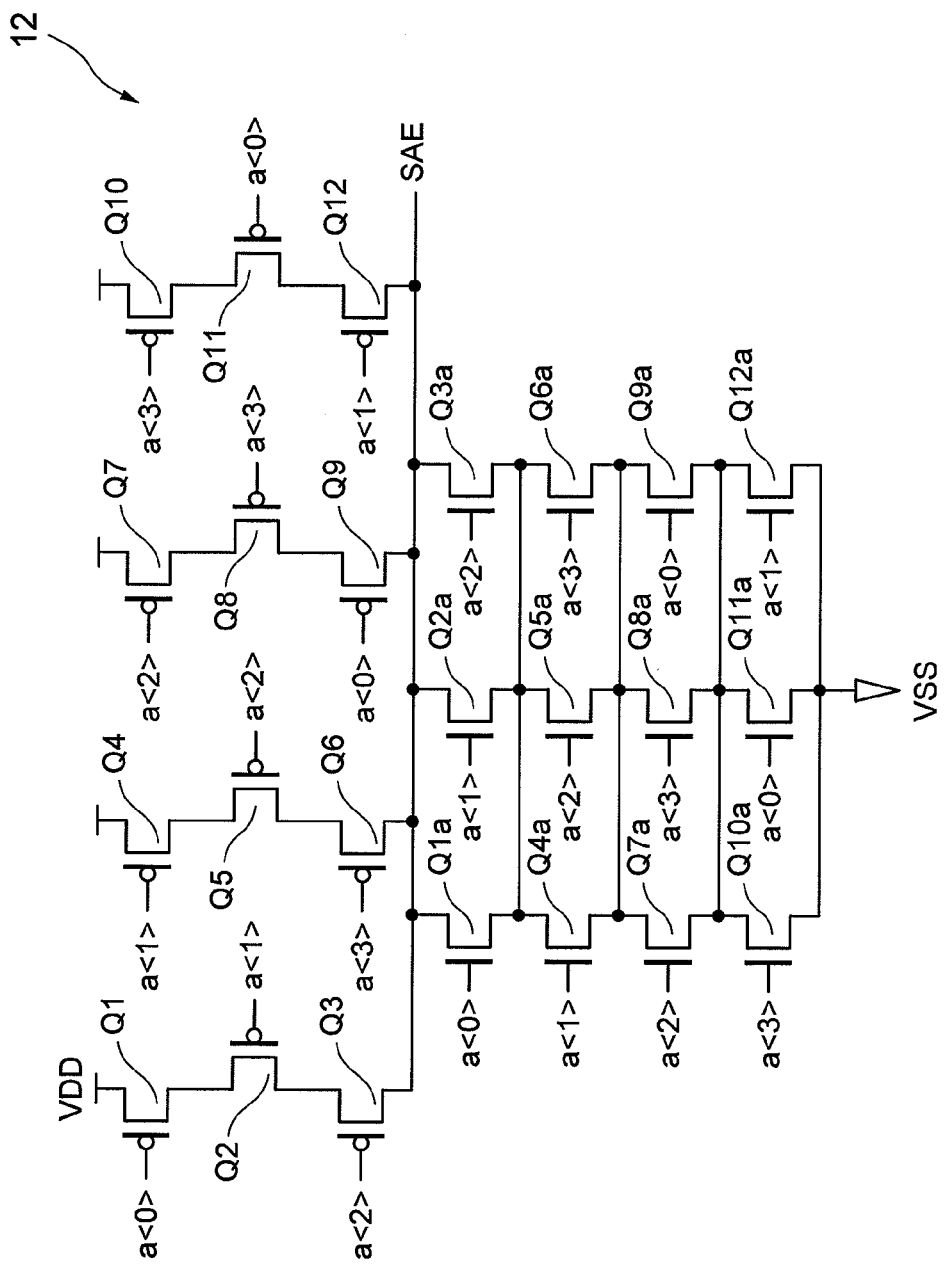
FIG. 22 is a circuit diagram showing the outline configuration of a modification of the 3/4 timing selection circuit according to the first embodiment of the present invention.

FIG. 22 is a circuit diagram showing the outline configuration of a modification of the 3/4 timing selection circuit according to the first embodiment of the present invention.

The PMOS transistors Q1 to Q12 have the same configuration as that of the 3/4 timing selection circuit 12 in FIG. 7 and thus, a description thereof is not repeated here.

NMOS transistors Q1a, Q4a, Q7a, and Q10a are connected in series between a point (hereinafter, referred to as an A point) to which drains of the PMOS transistors Q3, Q6, Q9, and Q12 connected in common and the ground voltage VSS. Signals a<0>, a<1>, a<2>, and a<3> are input into gates of the NMOS transistors Q1a, Q4a, Q7a, and Q10a respectively.

NMOS transistors Q2a, Q5a, Q8a, and Q11a are connected in series between the A point and the ground voltage VSS. Signals a<1>, a<2>, a<3>, and a<0> are input into gates of the NMOS transistors Q2a, Q5a, Q8a, and Q11a respectively.

NMOS transistors Q3a, Q6a, Q9a, and Q12a are connected in series between the A point and the ground voltage VSS. Signals a<2>, a<3>, a<0>, and a<1> are input into gates of the NMOS transistors Q3a, Q6a, Q9a, and Q12a respectively.

Sources of the NMOS transistors Q1a, Q2a, and Q3a are mutually connected, sources of the NMOS transistors Q4a, Q5a, and Q6a are mutually connected, and sources of the NMOS transistors Q7a, Q8a, and Q9a are mutually connected.

The sense amplifier enable signal SAE is output from the A point.

In the initial state, the signals a<0>, a<1>, a<2>, and a<3> are at the high level. At this point, the NMOS transistors Q1a to Q12a are On and the PMOS transistors Q1 to Q12 are Off and thus, the sense amplifier enable signal SAE is at the low level.

Here, a case when, for example, the signals a<0>, a<1>, and a<2> fall to the low level from the high level successively and the signal a<3> maintains the high level will be considered. In this case, the PMOS transistors Q1, Q2, and Q3 are turned on and the NMOS transistors Q1a, Q2a, and Q3a are turned off in the timing when all the signals a<0>, a<1>, and a<2> fall to the low level and thus, the sense amplifier enable signal SAE rises to the high level. Other transistors are also turned on or off, but a description thereof is not repeated here.

Thus, like the 3/4 timing selection circuit 12 in FIG. 7, the 3/4 timing selection circuit 12 in FIG. 22 also outputs the sense amplifier enable signal SAE in the third earliest timing among timings in which four signals a<0> to a<3> change.
(Modification of the 2/4 Timing Selection Circuit)

The 2/4 timing selection circuit 16a-1 or the like as configured in FIG. 15 may be configured as described below. This circuit can be configured without using the signal discharge.

Figure 23:
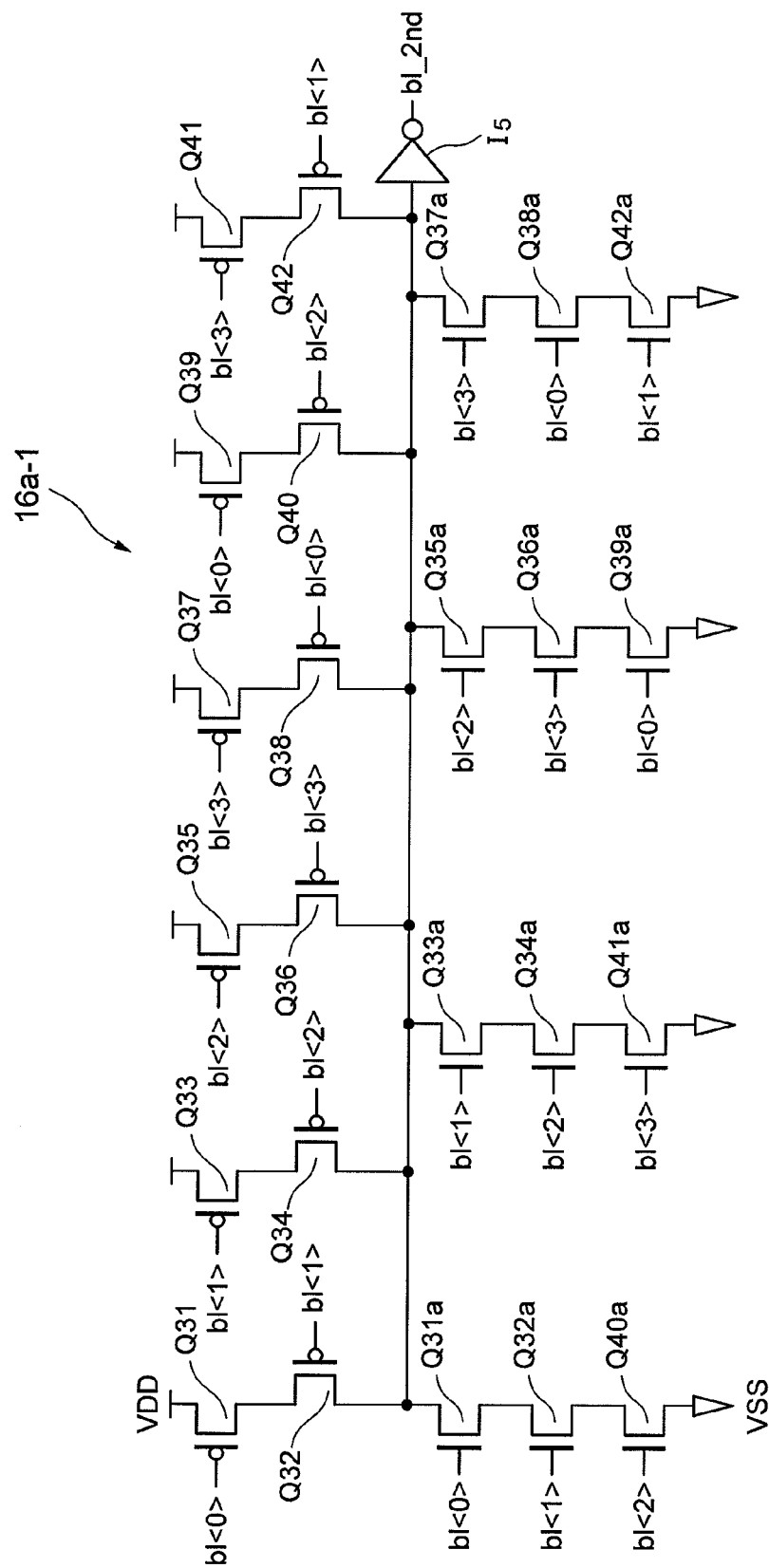
FIG. 23 is a circuit diagram showing the outline configuration of a modification of the 2/4 timing selection circuit according to the second embodiment of the present invention.

FIG. 23 is a circuit diagram showing the outline configuration of a modification of the 2/4 timing selection circuit according to the second embodiment of the present invention.

The PMOS transistors Q31 to Q42 and the inverter I5 have the same configuration as that of the 2/4 timing selection circuit 16a-1 in FIG. 15 and thus, a description thereof is not repeated here.

NMOS transistors Q31a, Q32a, and Q40a are connected in series between the input terminal of the inverter I5 and the ground voltage VSS. Signals bl<0>, bl<1>, and bl<2> are input into gates of the NMOS transistors Q31a, Q32a, and Q40a respectively.

NMOS transistors Q33a, Q34a, and Q41a are connected in series between the input terminal of the inverter I5 and the ground voltage VSS. Signals bl<1>, bl<2>, and bl<3> are input into gates of the NMOS transistors Q33a, Q34a, and Q41a respectively.

NMOS transistors Q35a, Q36a, and Q39a are connected in series between the input terminal of the inverter I5 and the ground voltage VSS. Signals bl<2>, bl<3>, and bl<0> are input into gates of the NMOS transistors Q35a, Q36a, and Q39a respectively.

NMOS transistors Q37a, Q38a, and Q42a are connected in series between the input terminal of the inverter I5 and the ground voltage VSS. Signals bl<3>, bl<0>, and bl<1> are input into gates of the NMOS transistors Q37a, Q38a, and Q42a respectively.

In the initial state, the signals bl<0>, bl<1>, bl<2>, and bl<3> are at the high level. At this point, the NMOS transistors Q31a to Q42a are On and the PMOS transistors Q31 to Q42 are Off and thus, the signal bl_2nd is at the high level.

Here, a case when, for example, the signals bl<0> and bl<1> fall to the low level from the high level successively and the signals bl<2> and bl<3> maintain the high level will be considered. In this case, the PMOS transistors Q31 and Q32 are turned on and the NMOS transistors Q31a, Q32a, Q33a, Q39a, Q38a, and Q42a are turned off in the timing when all the signals bl<0> and bl<1> fall to the low level and thus, the signal bl_2nd falls to the low level. Other transistors are also turned on or off, but a description thereof is not repeated here.

Thus, like the 2/4 timing selection circuit 16a-1 in FIG. 15, the 2/4 timing selection circuit 16a-1 in FIG. 23 also changes the signal bl_2nd in the second earliest timing among timings in which four signals bl<0> to bl<3> change.

In the first and second embodiments and the modifications, examples in which the timing generation circuits 10, 10a, and 10b are applied to the semiconductor storage device 1 are described, but the timing generation circuits 10, 10a, and 10b can also be applied to any other circuit.

That is, according to the timing generation circuits 10, 10a, and 10b in the first and second embodiments and the modifications, the timing in a preset order is selected from among a plurality of timings varied with respect to the average value and the timing is generated based on the selected timing and therefore, appropriate timing in accordance with the distribution of variations can be generated even if the distribution of variations changes. Thus, any circuit can be controlled in the appropriate timing.

The timing generation circuits 10, 10a, and 10b may select the timing in a preset order from among a plurality of timings based on any selection algorithm other than the selection algorithm described in the first and second embodiments and the modifications. As described above, the selection algorithm can be decided based on a numerical calculation.

That is, any selection algorithm, that selects a timing in some order for each group from among the timings in which the plurality of bit line signals change, the timings being divided into a plurality of groups, repeats, one or more times, a process of selecting a timing in some order for each group from among a predetermined number of timings divided into one group or more and selected immediately before, until the single timing is ultimately selected, and sets the single timing ultimately selected as the timing in the preset order, may be selected. The timing in a different order may be selected each time. Or, the timing in a different order may be selected for each group.

As an example of changing the selection algorithm, a portion of logic circuit in the 64/64 timing selection circuits 11-1 to 11-4 in the first embodiment may be replaced with another logic circuit. Desired timing can be obtained by changing the selection algorithm in this manner and thus, appropriate timing can be obtained even if conditions such as the power supply voltage VDD may change.

For example, X, Y, and Z in the first embodiment and A, B, and C in the second embodiment may be changed to values so that desired timing can be obtained using a numerical calculation.

Instead of the 3/4 timing selection circuit 12 in the first embodiment, a timing selection circuit that outputs the sense enable signal SAE based on a signal in the earliest timing (Z=1), a signal in the second earliest timing (Z=2), or a signal in the latest timing (Z=4) may be used.

For example, a signal in the earliest timing has a delay time in the position of +1.9σ from the average value in the distribution of bit line delay time in which the potential difference of 300 mV appears in a pair of bit line signals.

A signal in the second earliest timing has a delay time in the position of +2.2σ from the average value in the above distribution.

Accordingly, the timing in a different order from the first embodiment can be selected and thus, the sense amplifiers 30 can be activated in appropriate timing even if the potential difference detectable by the sense amplifiers 30 or the potential difference in which the timing generation circuit 10 can determine logic is different from the first embodiment.

In the second embodiment, an example realizing +6σ (bit line delay 4T) based on the timing (bit line delay 1T) in the first preset order and the timing (bit line delay 1.5T) in the second preset order is described, but as described above, the second embodiment is not limited to this. If any other timing than the above timings should be selected, the selection algorithm of the third timing selection circuit 16-1 and the fourth timing selection circuit 16-2 may be changed. For example, A, B, and C in the second embodiment may be changed to values to obtain desired timing by using a numerical calculation. Then, in the timing multiplier 17 shown in FIG. 17, desired t_worst may be calculated by changing the number of the unit delay circuits 17x in the second delay circuits 17b.

In the first and second embodiments and the modifications, an example having 256 pairs of bit lines blt<0> to blt<255> and blc<0> to blc<255> is described, but the number of bit lines may be any number.

The logic of each signal described in the first and second embodiments and the modifications may be reversed.

An example where the semiconductor storage device 1 in the first embodiment has 64 pairs of bit lines blt<0> to blt<63> and blc<0> to blc<63> will be considered. In this case, the 64/64 timing selection circuit 11-1 shown in FIG. 6 can be used as the timing selection circuit 10. The 64/64 timing selection circuit 11-1 outputs the signal a<0> as the sense amplifier enable signal SAE. As described above, a portion of logic circuit in the 64/64 timing selection circuit 11-1 may be replaced with another logic circuit. Accordingly, desired timing can be obtained. When the number of bit lines is changed, the number of logic circuits in the 64/64 timing selection circuit 11-1 may be changed so that the single timing is ultimately selected.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor storage device, comprising:
a memory cell array comprising a plurality of word lines, a plurality of bit lines crossing the plurality of word lines, and a plurality of memory cells provided in intersection portions of the plurality of word lines and the plurality of bit lines;
a plurality of sense amplifiers configured to detect a signal level of the corresponding bit lines; and
a timing generation circuit comprising a timing selection circuit configured to select a timing in a preset order from among timings in which each bit line signal in the plurality of bit lines changes, the timing generation circuit being configured to generate activation timing to activate the plurality of sense amplifiers based on the selected timing, wherein the timing selection circuit
selects a timing in some order for each group from among the timings in which the plurality of bit line signals change, the timings being divided into a plurality of groups,
repeats, one or more times, a process of selecting a timing in some order for each group from among a predetermined number of timings divided into one group or more and selected immediately before, until the single timing is ultimately selected, and
sets the single timing ultimately selected as the timing in the preset order,
wherein
the timing selection circuit comprises:
a first timing selection circuit configured to select Y (Y is a positive integer)-th earliest timing for each group from among the timings in which the plurality of bit line signals change, the timings being divided into X (X is an integer equal to 2 or greater) groups in advance; and
a second timing selection circuit configured to select Z-th earliest timing from among the X selected Y-th earliest timings, as the timing in the preset order and the timing generation circuit outputs the timing in the preset order as the activation timing.

2. A semiconductor storage device, comprising:

a memory cell array comprising a plurality of word lines, a plurality of bit lines crossing the plurality of word lines, and a plurality of memory cells provided in intersection portions of the plurality of word lines and the plurality of bit lines;

a plurality of sense amplifiers configured to detect a signal level of the corresponding bit lines; and a timing generation circuit comprising a timing selection circuit configured to select a timing in a preset order from among timings in which each bit line signal in the plurality of bit lines changes, the timing generation circuit being configured to generate activation timing to activate the plurality of sense amplifiers based on the selected timing, wherein the timing generation circuit comprises a timing computing unit configured to subtract a timing in which a signal of the word line changes from the timing in the preset order, configured to multiply a subtraction result by an integer, and configured to add a result multiplied by the integer to the timing in which the signal of the word line changes, to output an addition result as the activation timing.

3. The semiconductor storage device according to claim 2, wherein the timing computing unit comprises a plurality of first delay circuits configuring a forward path and connected in series and a plurality of second delay circuits configuring a backward path and connected in series, the backward path transmits the signal in a direction opposite to the forward path, the plurality of first delay circuits and the plurality of second delay circuits are provided in a one-to-one correspondence, when the signal of the word line is delayed by the n (n is a positive integer) first delay circuits to have same timing as the timing in the preset order, the forward path supplies the delayed signal of the word line to the corresponding second delay circuit in the backward path, and the backward path delays the signal of the word line delayed by the forward path by the n second delay circuits, to output the signal as a timing signal having the activation timing.

4. A semiconductor storage device, comprising:

a memory cell array comprising a plurality of word lines, a plurality of bit lines crossing the plurality of word lines, and a plurality of memory cells provided in intersection portions of the plurality of word lines and the plurality of bit lines;

a plurality of sense amplifiers configured to detect a signal level of the corresponding bit lines; and a timing generation circuit comprising a timing selection circuit configured to select a timing in a preset order from among timings in which each bit line signal in the plurality of bit lines changes, the timing generation circuit being configured to generate activation timing to activate the plurality of sense amplifiers based on the selected timing, wherein the timing selection circuit comprises:

a first timing selection circuit configured to select a timing in some order for each group from among the timings in which the plurality of bit line signals change, the timings being divided into a plurality of groups, configured to repeat, one or more times, a process of selecting a timing in some order for each group from among a predetermined number of timings divided into one group or more and selected immediately before, until the single timing is ultimately selected, and configured to set the single timing ultimately selected as a timing in a first preset order; and a second timing selection circuit configured to select a timing in some order for each group from among the timings in which the plurality of bit line signals change, the timings being divided into a plurality of groups, configured to repeat, one or more times, the process of selecting a timing in some order for each group from among a predetermined number of timings divided into one group or more and selected immediately before, until the single timing is ultimately selected, and configured to set the single timing ultimately selected, later than the timing in the first preset order, as a timing in a second preset order, and the timing generation circuit further comprises:

a timing computing unit configured to subtract the timing in the first preset order from the timing in the second preset order, configured to multiply a subtraction result by an integer, and configured to add a result multiplied by the integer to the timing in the first preset order, to output an addition result as the activation timing.

5. The semiconductor storage device according to claim 4, wherein the first timing selection circuit selects B (B is a positive integer less than A)-th earliest timing from among the timings in which the each bit line signal changes, in each group formed of A (A is an integer equal to 2 or greater) bit line signals of the plurality of bit line signals, and repeats the process of selecting the B-th earliest timing for each group formed of A signals of a plurality of the selected B-th earliest timings, until the single B-th earliest timing is selected, and sets the single B-th earliest timing ultimately selected as the timing in the first preset order, and the second timing selection circuit selects C (C is an integer greater than B and equal to or less than A)-th earliest timing from among the timings in which the each bit line signal changes, in each group formed of A bit line signals of the plurality of bit line signals, and repeats the process of selecting the C-th earliest timing for each group formed of A signals of a plurality of the selected C-th earliest timings, until the single C-th earliest timing is selected, and sets the single C-th earliest timing ultimately selected as the timing in the second preset order.

6. The semiconductor storage device according to claim 4, wherein the timing computing unit comprises a plurality of first delay circuits configuring a forward path and connected in series and a plurality of second delay circuits configuring a backward path and connected in series, the backward path transmits the signal in a direction opposite to the forward path, the plurality of first delay circuits and the plurality of second delay circuits are provided in a one-to-one correspondence, when a timing signal having the timing in the first preset order is delayed by the n (n is a positive integer) first delay circuits to have same timing as the timing in the second preset order, the forward path supplies the delayed timing signal having the timing in the first preset order to the corresponding second delay circuit in the backward path, and the backward path delays the timing signal having the timing in the first preset order delayed by the forward path by the n second delay circuits, to output the timing signal as the timing signal having the activation timing.

7. A timing generation circuit, comprising:

a timing selection circuit, a plurality of timing signals being input into the timing selection circuit, the plurality of timing signals having timings that vary with respect to an average value thereof, the timing selection circuit being configured to select a timing in a preset order from the timings, wherein the timing generation circuit generates reference timing based on the selected timing, wherein the timing selection circuit selects a timing in some order for each group from among the timings of the plurality of timing signals, the timings being divided into a plurality of groups, repeats, one or more times, a process of selecting a timing in some order for each group from among a predetermined number of timings divided into one group or more and selected immediately before, until the single timing is ultimately selected, and sets the single timing ultimately selected as the timing in the preset order, wherein the timing selection circuit comprises:

a first timing selection circuit configured to select Y (Y is a positive integer)-th earliest timing for each group from among the timings of the plurality of timing signals, the timings being divided into X (X is an integer equal to 2 or greater) groups in advance; and a second timing selection circuit configured to select Z-th earliest timing from among the X selected Y-th earliest timings as the timing in the preset order, and the timing generation circuit outputs the timing in the preset order as the reference timing.

8. A timing generation circuit, comprising:

a timing selection circuit, a plurality of timing signals being input into the timing selection circuit, the plurality of timing signals having timings that vary with respect to an average value thereof, the timing selection circuit being configured to select a timing in a preset order from the timings, wherein the timing generation circuit generates reference timing based on the selected timing, wherein the timing selection circuit comprises:

a first timing selection circuit configured to select a timing in some order for each group from among the timings of the plurality of timing signals, the timings being divided into a plurality of groups, configured to repeat, one or more times, a process of selecting a timing in some order for each group from among a predetermined number of timings divided into one group or more and selected immediately before, until the single timing is ultimately selected, and configured to set the single timing ultimately selected as a timing in a first preset order; and a second timing selection circuit configured to select a timing in some order for each group from among the timings of the plurality of timing signals, the timings being divided into the plurality of groups, configured to repeat, one or more times, the process of selecting a timing in some order for each group from among a predetermined number of timings divided into one group or more and selected immediately before, until the single timing is ultimately selected, and configured to set the single timing ultimately selected, later than the timing in the first preset order, as a timing in a second preset order, and the timing generation circuit further comprises:

a timing computing unit configured to subtract the timing in the first preset order from the timing in the second preset order, configured to multiply a subtraction result by an integer, and configured to add a result multiplied by the integer to the timing in the first preset order, to output an addition result as the activation timing.

9. The timing generation circuit according to claim 7, wherein the first timing selection circuit selects B (B is a positive integer less than A)-th earliest timing from among the timings in which the each timing signal changes, in each group formed of A (A is an integer equal to 2 or greater) timing signals of the plurality of timing signals, and repeats the process of selecting the B-th earliest timing for each group formed of A signals of a plurality of the selected B-th earliest timings, until the single B-th earliest timing is selected, and sets the single B-th earliest timing ultimately selected as the timing in the first preset order, and the second timing selection circuit selects C (C is an integer greater than B and equal to or less than A)-th earliest timing from among the timings in which the each timing signal changes, in each group formed of A timing signals of the plurality of timing signals, and repeats the process of selecting the C-th earliest timing for each group formed of A signals of a plurality of the selected C-th earliest timings, until the single C-th earliest timing is selected, and sets the single C-th earliest timing ultimately selected as the timing in the second preset order.

* * * * *